US011876058B2

(12) United States Patent
Ootsuka et al.

(10) Patent No.: US 11,876,058 B2
(45) Date of Patent: Jan. 16, 2024

(54) ISOLATOR

(71) Applicants: Kabushiki Kaisha Toshiba, Tokyo (JP); Toshiba Electronic Devices & Storage Corporation, Tokyo (JP)

(72) Inventors: Kenichi Ootsuka, Nonoichi Ishikawa (JP); Mari Ootsuka, Oita Oita (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 323 days.

(21) Appl. No.: 17/016,686

(22) Filed: Sep. 10, 2020

(65) Prior Publication Data
US 2021/0305179 A1    Sep. 30, 2021

(30) Foreign Application Priority Data

Mar. 24, 2020  (JP) ................................ 2020-052570

(51) Int. Cl.
 *H01L 23/64* (2006.01)
 *H01F 27/28* (2006.01)
 *H01L 49/02* (2006.01)

(52) U.S. Cl.
 CPC ....... *H01L 23/645* (2013.01); *H01F 27/2804* (2013.01); *H01L 28/10* (2013.01); *H01F 2027/2809* (2013.01)

(58) Field of Classification Search
 CPC ... H01L 23/645; H01L 28/10; H01L 23/5222; H01L 23/5223; H01L 23/5227; H01L 23/642; H01L 27/0288; H01L 2223/6655; H01F 27/2804
 See application file for complete search history.

(56) References Cited

U.S. PATENT DOCUMENTS

| | | | | |
|---|---|---|---|---|
| 8,385,043 | B2* | 2/2013 | Ng ...................... | H04L 25/0266 361/268 |
| 2005/0230837 | A1* | 10/2005 | Taghizadeh-Kaschani | ................. H01L 23/585 257/760 |
| 2008/0061631 | A1* | 3/2008 | Fouquet .............. | H04L 25/0266 307/109 |
| 2008/0278255 | A1* | 11/2008 | Harvey ................. | H01L 23/495 257/E23.031 |
| 2010/0259909 | A1* | 10/2010 | Ho ........................... | H03H 7/46 361/767 |
| 2013/0075861 | A1* | 3/2013 | Kerber ................... | H01L 24/05 257/532 |

(Continued)

FOREIGN PATENT DOCUMENTS

JP       2018-078169 A     5/2018

*Primary Examiner* — Eduardo A Rodela
(74) *Attorney, Agent, or Firm* — Allen & Overy LLP

(57) ABSTRACT

According to one embodiment, an isolator includes a first electrode, a second electrode, a conductive body, and a first insulating layer. The second electrode is provided on the first electrode and separated from the first electrode. The conductive body is provided around the first and second electrodes along a first plane perpendicular to a first direction. The first direction is from the first electrode toward the second electrode. The first insulating layer is provided on the second electrode. The first insulating layer includes silicon, carbon, and nitrogen.

18 Claims, 20 Drawing Sheets

(56) References Cited

U.S. PATENT DOCUMENTS

| | | | |
|---|---|---|---|
| 2013/0278372 A1* | 10/2013 | Stecher | H01L 23/5227 336/200 |
| 2013/0341793 A1* | 12/2013 | Suzumura | H01L 21/7682 257/774 |
| 2018/0130587 A1 | 5/2018 | Tanaka et al. | |
| 2018/0286802 A1 | 10/2018 | West et al. | |
| 2021/0020564 A1* | 1/2021 | West | H01L 23/5227 |

* cited by examiner

ISOLATOR

CROSS-REFERENCE TO RELATED APPLICATIONS

This application is based upon and claims the benefit of priority from Japanese Patent Application No. 2020-052570, filed on Mar. 24, 2020; the entire contents of which are incorporated herein by reference.

FIELD

Embodiments described herein relate generally to an isolator.

BACKGROUND

An isolator transmits a signal by utilizing the change of a magnetic field or an electric field in a state in which the current is blocked. It is desirable to increase the reliability of the isolator.

DETAILED DESCRIPTION

Figure 1:
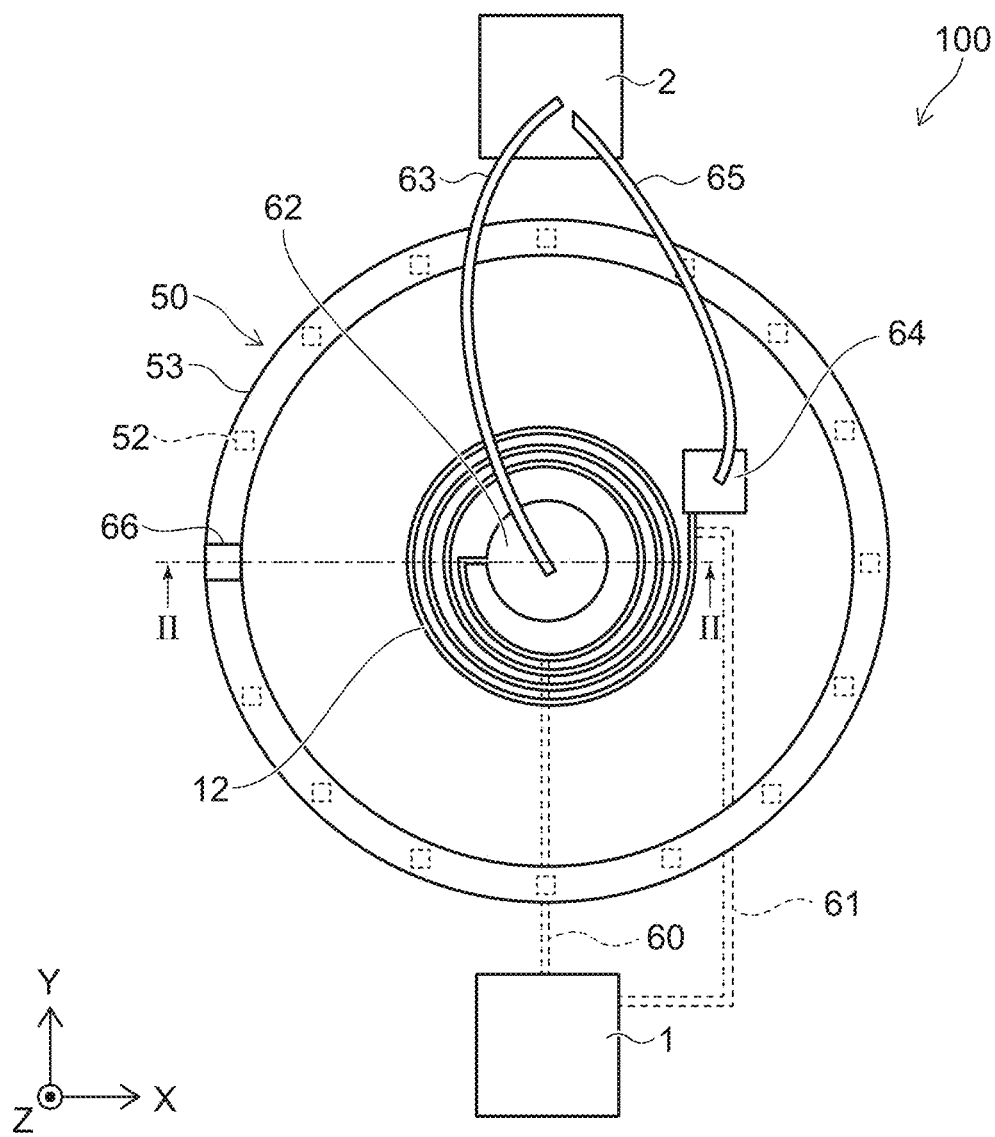
FIG. 1 is a plan view illustrating an isolator according to a first embodiment.

According to one embodiment, an isolator includes a first electrode, a second electrode, a conductive body, and a first insulating layer. The second electrode is provided on the first electrode and separated from the first electrode. The conductive body is provided around the first and second electrodes along a first plane perpendicular to a first direction. The first direction is from the first electrode toward the second electrode. The first insulating layer is provided on the second electrode. The first insulating layer includes silicon, carbon, and nitrogen.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 2:
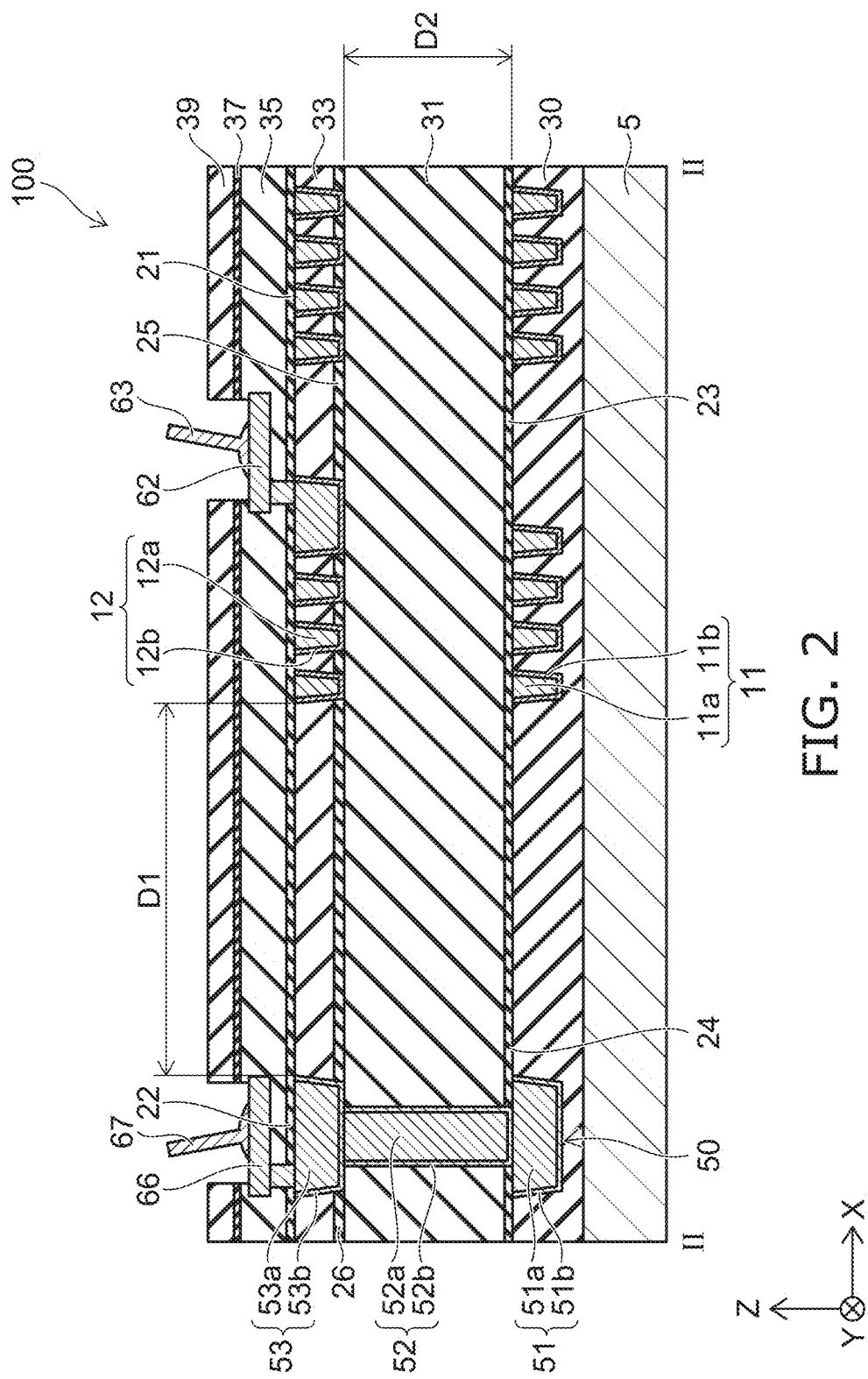
FIG. 2 is a II-II cross-sectional view of FIG. 1.

FIG. 1 is a plan view illustrating an isolator according to a first embodiment. FIG. 2 is a II-II cross-sectional view of FIG. 1.

The isolator according to the first embodiment relates to a device called a digital isolator, a galvanic isolator, a galvanic isolation element, etc.

As illustrated in FIGS. 1 and 2, the isolator 100 according to the first embodiment includes a first circuit 1, a second circuit 2, a substrate 5, a first electrode 11, a second electrode 12, a first insulating layer 21, a second insulating layer 22, a third insulating layer 23, a fourth insulating layer 24, insulating layers 25 and 26, a first insulating portion 31, insulating portions 30, 33, 35, 37, and 39, and a conductive body 50. The first insulating layer 21, the second insulating layer 22, and the insulating portions 35, 37, and 39 are not illustrated in FIG. 1.

An XYZ orthogonal coordinate system is used in the description of the embodiments. The direction from the first electrode 11 toward the second electrode 12 is taken as a Z-direction (a first direction). Two mutually-orthogonal directions perpendicular to the Z-direction are taken as an X-direction (a second direction) and a Y-direction (a third direction). In the description, the direction from the first electrode 11 toward the second electrode 12 is called "up", and the reverse direction is called "down". These directions are based on the relative positional relationship between the first electrode 11 and the second electrode 12 and are independent of the direction of gravity.

As illustrated in FIG. 2, the insulating portion 30 is provided on the substrate 5. The first electrode 11 is provided inside the insulating portion 30. The first insulating portion 31 is provided on the first electrode 11. The second electrode 12 is provided on the first insulating portion 31 and is separated from the first electrode 11. The second electrode 12 is electrically isolated from the first electrode 11.

In the example illustrated in FIGS. 1 and 2, the first electrode 11 and the second electrode 12 are coils provided in spiral configurations along the X-Y plane (a first plane). The first electrode 11 and the second electrode 12 face each other in the Z-direction. At least a portion of the second electrode 12 is arranged with at least a portion of the first electrode 11 in the Z-direction.

The conductive body 50 is provided around the first electrode 11 and the second electrode 12 along the X-Y plane. Specifically, the conductive body 50 includes a first conductive portion 51, a second conductive portion 52, and a third conductive portion 53. The first conductive portion 51 is provided around the first electrode 11 along the X-Y plane. The second conductive portion 52 is provided on a portion of the first conductive portion 51. Multiple second conductive portions 52 are provided along the first conductive portion 51. The third conductive portion 53 is provided on the multiple second conductive portions 52. The third conductive portion 53 is positioned around the second electrode 12 along the X-Y plane.

For example, a distance D1 in the X-direction between the second electrode 12 and the conductive body 50 is greater than a distance D2 in the Z-direction between the first electrode 11 and the second electrode 12.

The first insulating layer 21 is provided on the second electrode 12. For example, the first insulating layer 21 contacts the second electrode 12. The second insulating layer 22 is provided on the third conductive portion 53. For example, the second insulating layer 22 contacts the third conductive portion 53. The second insulating layer 22 is continuous with the first insulating layer 21. In other words, one insulating layer that is provided on the second electrode 12 and the conductive body 50 may function as the first insulating layer 21 and the second insulating layer 22. Or, the second insulating layer 22 may be separated from the first insulating layer 21 and provided around the second insulating layer 22 along the X-Y plane.

The third insulating layer 23 is provided between the first electrode 11 and the first insulating portion 31. For example, the third insulating layer 23 contacts the first electrode 11. The fourth insulating layer 24 is provided around the bottom portion of the second conductive portion 52 along the X-Y plane. For example, the fourth insulating layer 24 contacts the second conductive portion 52 and another portion of the first conductive portion 51. The fourth insulating layer 24 is continuous with the third insulating layer 23. Or, the fourth insulating layer 24 may be separated from the third insulating layer 23 and provided around the third insulating layer 23 along the X-Y plane.

The insulating layer 25 is provided around the second electrode 12 bottom portion along the X-Y plane. The insulating layer 26 is provided around the bottom portion of the third conductive portion 53. The insulating layer 26 is continuous with the insulating layer 25. Or, the insulating layer 26 may be separated from the insulating layer 25 and provided around the insulating layer 25 along the X-Y plane. The insulating portion 33 is provided on the insulating layers 25 and 26. The insulating portion 33 is positioned around the second electrode 12 and around the third conductive portion 53 along the X-Y plane.

In the example illustrated in FIG. 1, one end of the first electrode 11 (one end of the coil) is electrically connected to the first circuit 1 via wiring 60. The other end of the first electrode 11 (the other end of the coil) is electrically connected to the first circuit 1 via wiring 61.

One end of the second electrode 12 (one end of the coil) is electrically connected to a pad 62. One end of wiring 63 is bonded to the pad 62. The one end of the second electrode 12 is electrically connected to the second circuit 2 via the pad 62 and the wiring 63.

The other end of the second electrode 12 (the other end of the coil) is electrically connected to a pad 64. One end of wiring 65 is bonded to the pad 64. The other end of the second electrode 12 is electrically connected to the second circuit 2 via the pad 64 and the wiring 65.

For example, the pad 62 is provided on the one end of the second electrode 12. The pad 64 is provided on the other end of the second electrode 12. Or, the position in the Z-direction of the pad 62 and the position in the Z-direction of the pad 64 may be the same as the position in the Z-direction of the second electrode 12. The pads 62 and 64 may be formed to have a continuous body with the second electrode 12.

As illustrated in FIG. 2, a pad 66 is provided on the conductive body 50. The conductive body 50 is electrically connected to a not-illustrated conductive member via the pad 66 and wiring 67. For example, the conductive body 50 and the substrate 5 are connected to a reference potential. The reference potential is, for example, a ground potential. Thereby, the conductive body 50 can be prevented from having a floating potential. The likelihood of unexpected dielectric breakdown occurring between the conductive body 50 and the electrodes due to fluctuation of the potential of the conductive body 50 can be reduced. Also, the first circuit 1 may be provided on the substrate 5. In such a case, by providing the conductive body 50 on the first circuit 1, the first circuit 1 is shielded by the conductive body 50 from electromagnetic waves directed toward the first circuit 1 from outside the substrate 5 and the conductive body 50. As a result, the operation of the first circuit 1 can be stabilized further.

The insulating portion 35 is provided along the X-Y plane around the pads 62 and 66. The insulating portion 37 is provided on the insulating portion 35. The insulating portion 39 is provided on the insulating portion 37. The pads 62, 64, and 66 are not covered with the insulating portions 35, 37, and 39 and are exposed externally.

One of the first circuit 1 or the second circuit 2 is used as a receiving circuit. The other of the first circuit 1 or the second circuit 2 is used as a transmitting circuit. In the description herein, the first circuit 1 is a receiving circuit, and the second circuit 2 is a transmitting circuit.

The second circuit 2 transmits, to the first electrode 11, a wave-like signal (current) suited to the transmission. When a current flows through the first electrode 11, a magnetic field that passes through the spiral first electrode 11 is generated. At least a portion of the first electrode 11 is arranged with at least a portion of the second electrode 12 in the Z-direction. A portion of the generated magnetic force lines passes through the second electrode 12. An induced electromotive force is generated in the second electrode 12 by the change of the magnetic field within the second electrode 12, and a current flows through the second electrode 12. The first circuit 1 detects the current flowing through the second electrode 12 and generates a signal corresponding to the detection result. Thereby, the signal is transmitted in the state in which the current is blocked (insulated) between the first electrode 11 and the second electrode 12.

Examples of the materials of the components of the isolator 100 will now be described.

The substrate 5 is, for example, a silicon substrate. For example, an impurity is added to the substrate 5, and the substrate 5 is conductive.

The first electrode 11, the second electrode 12, the conductive body 50, the pad 62, the pad 64, and the pad 66 include metals. For example, the first electrode 11, the second electrode 12, the conductive body 50, the pad 62, the pad 64, and the pad 66 include a metal selected from the group consisting of copper and aluminum. It is favorable for the electrical resistances of these components to be low to suppress the heat generation in the first and second electrodes 11 and 12 when transmitting the signal. From the perspective of reducing the electrical resistance, it is favorable for the first electrode 11, the second electrode 12, the conductive body 50, the pad 62, the pad 64, and the pad 66 to include copper.

The insulating portion 30, the first insulating portion 31, the insulating portion 33, and the insulating portion 35 include silicon and oxygen. For example, the insulating portion 30, the first insulating portion 31, the insulating portion 33, and the insulating portion 35 include silicon oxide. The insulating portion 30, the first insulating portion 31, the insulating portion 33, and the insulating portion 35 may further include nitrogen. The insulating portion 37 includes silicon and nitrogen. For example, the insulating portion 37 includes silicon nitride. The insulating portion 39 includes an insulating resin such as polyimide, polyamide, etc.

The wiring 63, 65, and 67 include metals such as aluminum, etc.

The first insulating layer 21 and the second insulating layer 22 include silicon, carbon, and nitrogen. The first insulating layer 21 and the second insulating layer 22 may further include hydrogen. The third insulating layer 23, the fourth insulating layer 24, the insulating layer 25, and the insulating layer 26 include silicon and nitrogen. For example, the third insulating layer 23, the fourth insulating layer 24, the insulating layer 25, and the insulating layer 26 include silicon nitride. By providing the first to fourth insulating layers 21 to 24, the diffusion into the insulating portions of the metal materials included in the first electrode 11, the second electrode 12, and the conductive body 50 can be suppressed. Also, by providing the third insulating layer 23, the leakage current between the first electrode 11 and the second electrode 12 can be reduced.

The first electrode 11 may include metal layers 11a and 11b. The metal layer 11b is provided between the metal layer 11a and the insulating portion 30. The second electrode 12 may include metal layers 12a and 12b. The metal layer 12b is provided between the metal layer 12a and the first insulating portion 31, between the metal layer 12a and the insulating layer 25, and between the metal layer 12a and the insulating portion 33. The metal layers 11a and 12a include copper. The metal layers 11b and 12b include tantalum. The metal layers 11b and 12b may include a stacked film of tantalum and tantalum nitride. By providing the metal layers 11b and 12b, the diffusion into the insulating portions of the metal materials included in the metal layers 11a and 12a can be suppressed.

The first conductive portion 51 may include metal layers 51a and 51b. The metal layer 51b is provided between the metal layer 51a and the insulating portion 30. The second conductive portion 52 may include metal layers 52a and 52b. The metal layer 52b is provided between the metal layer 52a and the first insulating portion 31, between the metal layer 52a and the fourth insulating layer 24, and between the metal layer 52a and the first conductive portion 51. The third conductive portion 53 may include metal layers 53a and 53b. The metal layer 53b is provided between the metal layer 53a and the first insulating portion 31, between the metal layer 53a and the insulating layer 26, between the metal layer 53a and the insulating portion 33, and between the metal layer 53a and the second conductive portion 52. The metal layers 51a to 53a include copper. The metal layers 51b to 53b include tantalum. The metal layers 51b to 53b may include stacked films of tantalum and tantalum nitride. By providing the metal layers 51b to 53b, the diffusion into the insulating portions of the metal materials included in the metal layers 51a to 53a can be suppressed.

Effects of the first embodiment will now be described.

Figure 3:
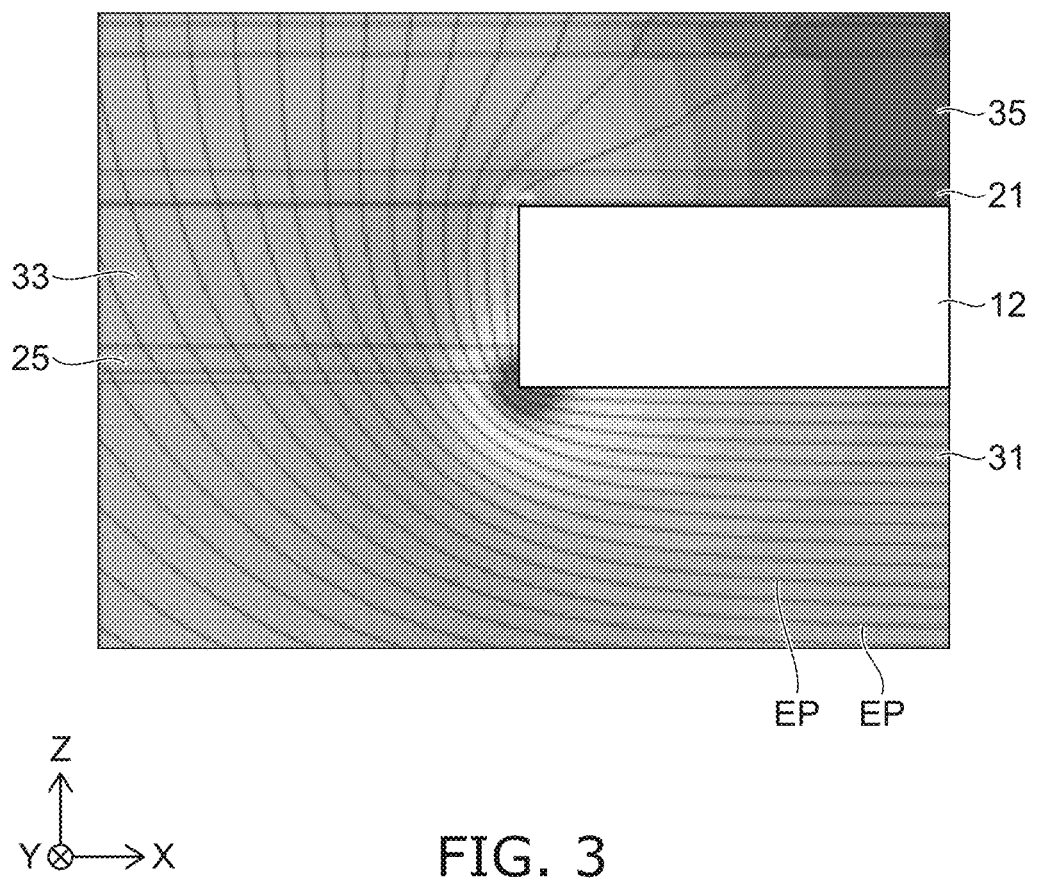
FIG. 3 is a schematic view illustrating a characteristic of the isolator according to the first embodiment.

FIG. 3 is a schematic view illustrating a characteristic of the isolator according to the first embodiment.

FIG. 3 illustrates equipotential lines EP at the outer perimeter vicinity of the second electrode 12. In the isolator 100, a positive voltage with respect to the first electrode 11 and the conductive body 50 is applied to the second electrode 12 when the signal is transmitted between the first electrode 11 and the second electrode 12. As illustrated in FIG. 3, a gradient of the potential from the second electrode 12 toward the first electrode 11 and a gradient of the potential from the second electrode 12 toward the conductive body 50 occur.

Figure 4B:
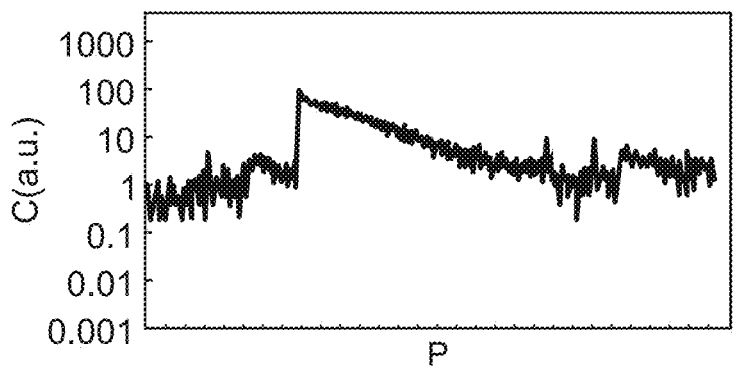
FIGS. 4A and 4B are a cross-sectional view illustrating a portion of an isolator according to a reference example and a graph illustrating analysis results of the isolator according to the reference example.
Figure 4A:
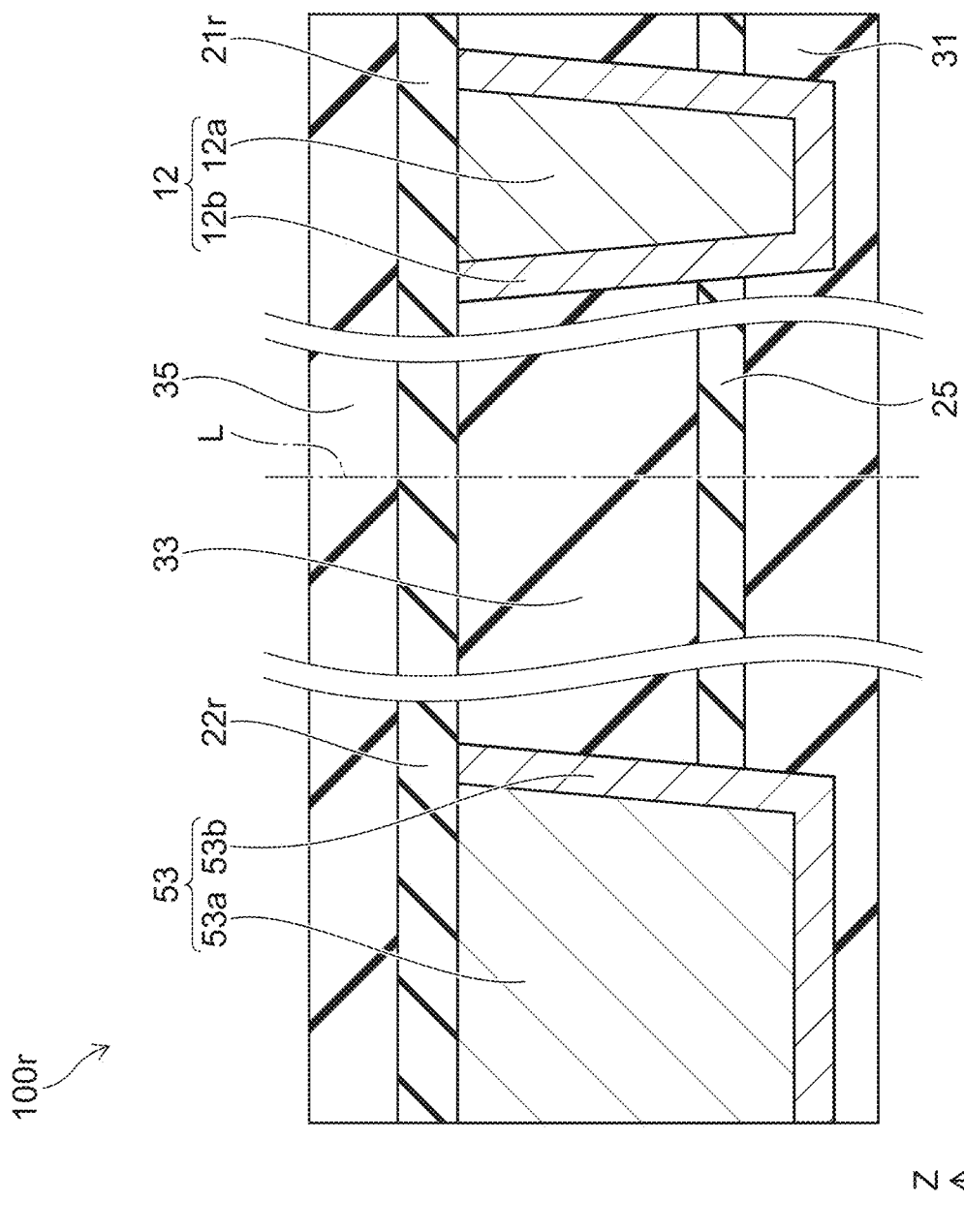

FIG. 4A is a cross-sectional view illustrating a portion of an isolator according to a reference example. FIG. 4B is a graph illustrating analysis results of the isolator according to the reference example.

Figures 5A, 5B:
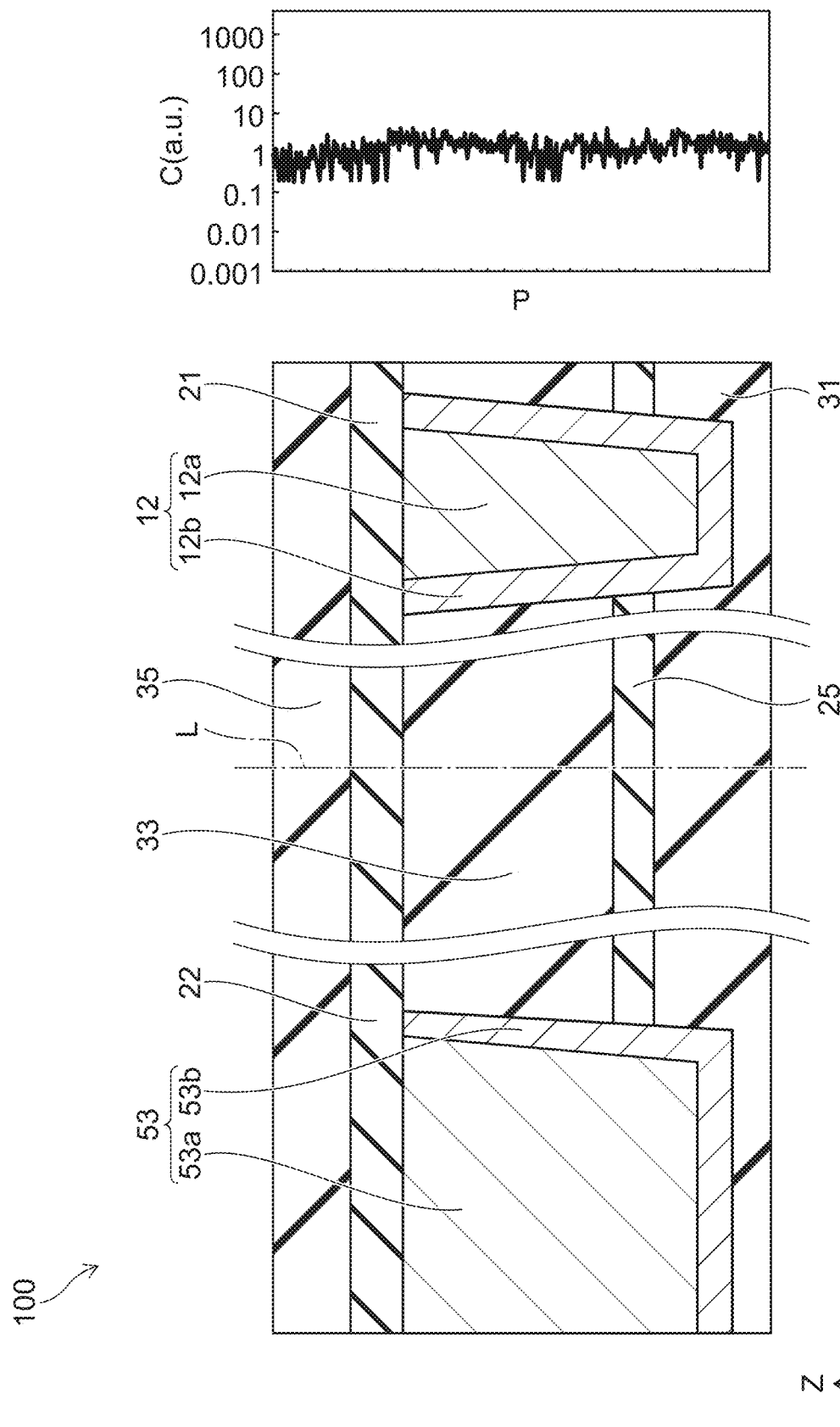
FIGS. 5A and 5B are a cross-sectional view illustrating a portion of the isolator according to the first embodiment and a graph illustrating analysis results of the isolator according to the first embodiment.

FIG. 5A is a cross-sectional view illustrating a portion of the isolator according to the first embodiment. FIG. 5B is a graph illustrating analysis results of the isolator according to the first embodiment.

In the isolator 100r according to the reference example, insulating layers 21r and 22r are provided respectively instead of the first and second insulating layers 21 and 22 as illustrated in FIG. 4A. The insulating layers 21r and 22r include nitrogen and silicon. The insulating layers 21r and 22r are formed without adding carbon and substantially do not include carbon.

FIGS. 4B and 5B respectively illustrate the results of elemental analysis along broken chain lines L recited in FIGS. 4A and 5A. Secondary ion mass spectrometry (SIMS) is used in the analysis. The broken chain line L is positioned between the second electrode 12 and the third conductive portion 53 in the X-direction. In FIGS. 4B and 5B, the vertical axis is a position P in the Z-direction. The horizontal axis is a concentration C of copper at positions in the Z-direction. The concentration C has arbitrary units.

Conventionally, silicon nitride is used as a barrier layer, a passivation layer, etc., to prevent the unintended diffusion or penetration of elements. Regardless, the inventors discovered that the concentration of copper is high at the insulating layer 21r vicinity between the second electrode 12 and the third conductive portion 53 as illustrated in FIG. 4B. Specifically, a peak of the concentration of copper can be confirmed at the interface between the insulating portion 33 and the insulating layer 21r. Copper is detected in the insulating portion 33 as well, and the concentration of copper decreases away from the interface.

When transmitting the signal in the isolator, for example, a high voltage of 0.6 kVrms or more is applied between the first electrode 11 and the second electrode 12. At this time, as illustrated in FIG. 3, a large gradient of the potential occurs not only between the first electrode 11 and the second electrode 12 but also between the conductive body 50 and the second electrode 12. It is considered that in the isolator 100r, the metal that is included in the second electrode 12 moves due to the gradient toward the conductive body 50 along the interface between the second electrode 12 and the insulating layer 21r. Also, it is considered that the metal that has moved toward the conductive body 50 diffuses toward the insulating portion 33 between the second electrode 12 and the conductive body 50. When the metal diffuses from the second electrode 12 toward the conductive body 50, a locally-large leakage current may flow along the diffused metal, and dielectric breakdown may occur between the second electrode 12 and the conductive body 50. Therefore, to reduce the likelihood of dielectric breakdown occurring, it is favorable for the diffusion of the metal from the second electrode 12 to be suppressed.

In the isolator 100 according to the first embodiment, the first insulating layer 21 includes silicon, carbon, and nitrogen. As illustrated in FIG. 5B, the inventors discovered that compared to the first insulating layer 21 to which carbon is not added, the diffusion of the metal of the second electrode 12 is suppressed when the first insulating layer 21 includes these materials. Specifically, a high-concentration metallic element such as that illustrated in FIG. 4B was not confirmed between the second electrode 12 and the conductive body 50. By suppressing the diffusion of the metal from the second electrode 12, the likelihood of dielectric breakdown occurring in the isolator 100 can be reduced. Also, the total operation time of the isolator 100 until dielectric breakdown is reached (the insulation life) can be increased. The reliability of the isolator 100 can be increased thereby.

It is considered that the reason the diffusion of the metal from the second electrode 12 is suppressed when the first insulating layer 21 includes silicon, carbon, and nitrogen is as follows.

In the insulating layer 21r to which carbon is not added, dangling bonds of silicon exist at the interface. Because silicon is relatively active, the metal of the second electrode 12 reacts with the silicon. The metal that reacts with the silicon moves along the interface of the insulating layer 21r toward the conductive body 50 due to the potential difference between the second electrode 12 and the conductive body 50.

On the other hand, in the first insulating layer 21 that includes silicon, carbon, and nitrogen, carbon exists at the sites at which dangling bonds exist in the insulating layer 21r, and the silicon is bonded with the carbon. In other words, compared to the insulating layer 21r, the number of dangling bonds of silicon is low in the first insulating layer 21. Therefore, the reaction between the metal of the second electrode 12 and silicon is suppressed. As a result, the metal does not move toward the conductive body 50 even when a potential difference is generated between the second electrode 12 and the conductive body 50.

Also, it is favorable for the second insulating layer 22 to be provided on the conductive body 50 to suppress the unintended diffusion of the metal included in the conductive body 50 (the third conductive portion 53). Compared to the insulating layer 22r, the diffusion of the metal of the conductive body 50 is suppressed when the second insulating layer 22 includes silicon, carbon, and nitrogen similarly to the first insulating layer 21.

To effectively suppress the diffusion of the metal, it is favorable for the carbon concentrations in the first and second insulating layers 21 and 22 to be not less than 10 mass % and not more than 45 mass %.

To reduce the leakage current between the second electrode 12 and the conductive body 50, it is favorable for the electrical resistances of the first and second insulating layers 21 and 22 to be higher. To increase the electrical resistance, it is favorable for a ratio $C1_N/C1_{Si}$ of a nitrogen concentration $C1_N$ (mass %) to a silicon concentration $C1_{Si}$ (mass %) in the first insulating layer 21 to be not less than 0.2 and not more than 0.8. It is favorable for a ratio $C2_N/C2_{Si}$ of a nitrogen concentration $C2_N$ (mass %) to a silicon concentration $C2_{Si}$ (mass %) in the second insulating layer 22 to be not less than 0.2 and not more than 0.8.

The first insulating layer 21 may further include hydrogen. In such a case, it is favorable for the hydrogen concentration in the first insulating layer 21 to be not less than 0.5 mass % and not more than 5 mass %. Similarly, the second insulating layer 22 may further include hydrogen. In such a case, it is favorable for the hydrogen concentration in the second insulating layer 22 to be not less than 0.5 mass % and not more than 5 mass %.

Modifications

FIGS. 6 to 9 are cross-sectional views illustrating isolators according to modifications of the first embodiment.

Figure 6:
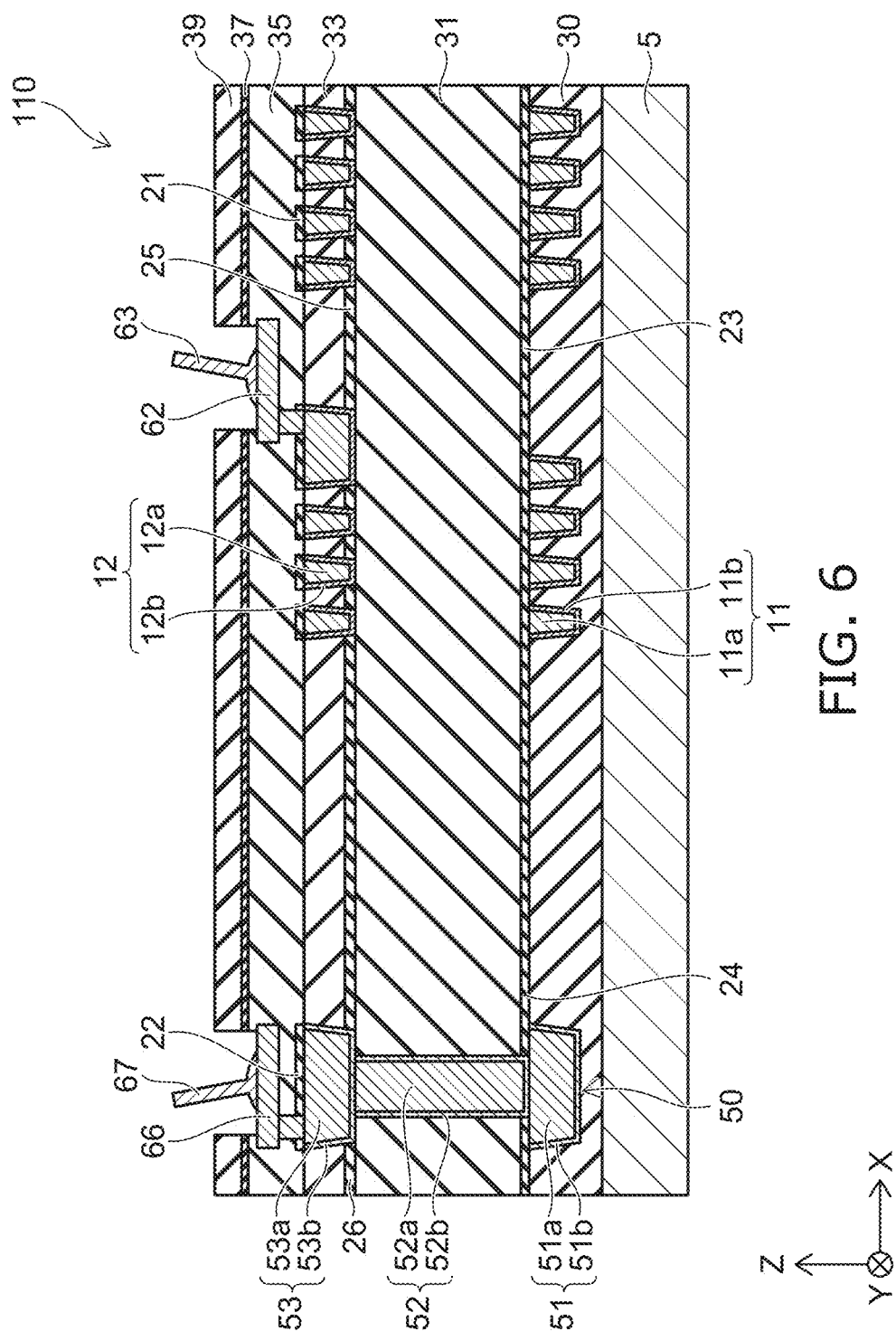
FIGS. 6 to 9 are cross-sectional views illustrating isolators according to modifications of the first embodiment.

In an isolator 110 illustrated in FIG. 6, the second insulating layer 22 is separated from the first insulating layer 21 along the X-Y plane. The first insulating layer 21 is provided at least on the second electrode 12. The second insulating layer 22 is provided at least on the third conductive portion 53. In such a case as well, similarly to the isolator 100, the diffusion of the metal included in the second electrode 12 can be suppressed.

Figure 7:
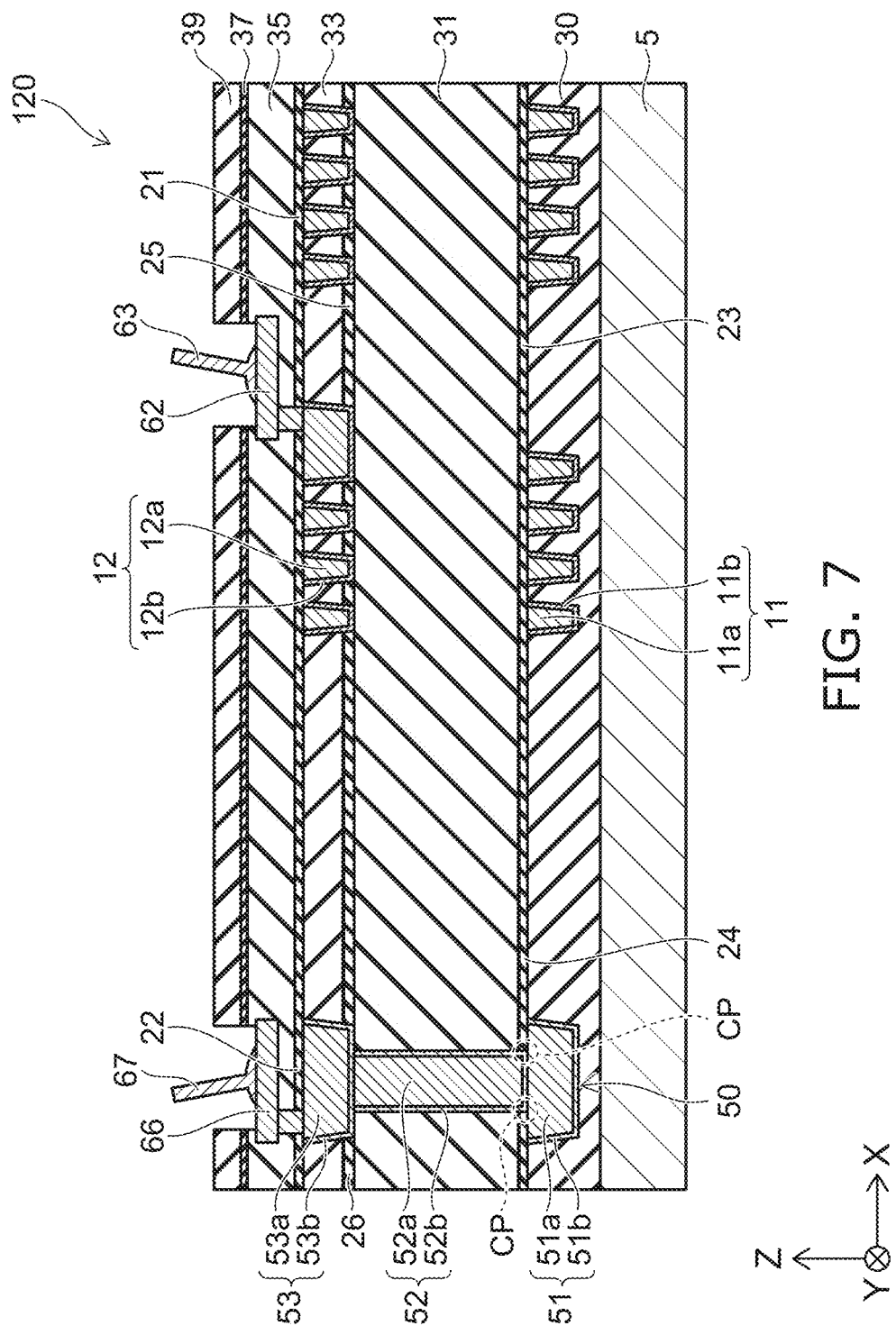

In an isolator 120 illustrated in FIG. 7, the fourth insulating layer 24 includes silicon, carbon, and nitrogen. The fourth insulating layer 24 may further include hydrogen. Heat is generated when currents flow in the first and second electrodes 11 and 12. Stress is applied to the insulating layers and the insulating portions that are adjacent to each other when thermal expansion of the first electrode 11, the second electrode 12, and the conductive body 50 occurs.

The Young's modulus of silicon nitride is greater than the Young's modulus of silicon oxide. In other words, silicon nitride deforms less easily than silicon oxide. When the fourth insulating layer 24 includes silicon and nitrogen, there is a possibility that a large stress may be applied to the fourth insulating layer 24 at a contact portion CP between the fourth insulating layer 24 and the bottom surface of the second conductive portion 52, and detachment or damage of the fourth insulating layer 24 may occur. Also, the thermal expansion amount of a metal layer including tantalum is greater than the thermal expansion amount of a metal layer including copper, aluminum, etc. Therefore, the thermal expansion amount along the X-Y plane of the metal layer 52b is large particularly at the bottom portion of the second conductive portion 52. In such a case, the likelihood of detachment or damage of the fourth insulating layer 24 occurring at the contact portion CP increases further.

The Young's modulus of the fourth insulating layer 24 when the fourth insulating layer 24 includes silicon, carbon, and nitrogen is less than the Young's modulus of the fourth insulating layer 24 when the fourth insulating layer 24 includes silicon and nitrogen. In other words, the fourth insulating layer 24 to which carbon is added deforms easily. According to the isolator 120, the detachment, the damage, etc., due to stress on the fourth insulating layer 24 due to thermal expansion at the contact portion CP are suppressed. The reliability of the isolator 120 is increased thereby.

The third insulating layer 23 may further include silicon, carbon, and nitrogen. The third insulating layer 23 may further include hydrogen. One insulating layer that includes silicon, carbon, and nitrogen may be provided on the first electrode 11 and around the bottom portion of the second conductive portion 52, and the one insulating layer may be used as the third insulating layer 23 and the fourth insulating layer 24.

According to verification by the inventors, diffusion of a metal from the first electrode 11 toward the conductive body 50 is not confirmed even when carbon is not added to the third and fourth insulating layers 23 and 24. It is considered that this is because there is no potential difference or the potential difference is small between the first electrode 11 and the conductive body 50 when transmitting the signal. Accordingly, from the perspective of the diffusion suppression of the metal, it is not always necessary to add carbon to the third and fourth insulating layers 23 and 24. It is favorable for the fourth insulating layer 24 to include silicon, carbon, and nitrogen to suppress detachment or damage of the fourth insulating layer 24.

Figure 8:
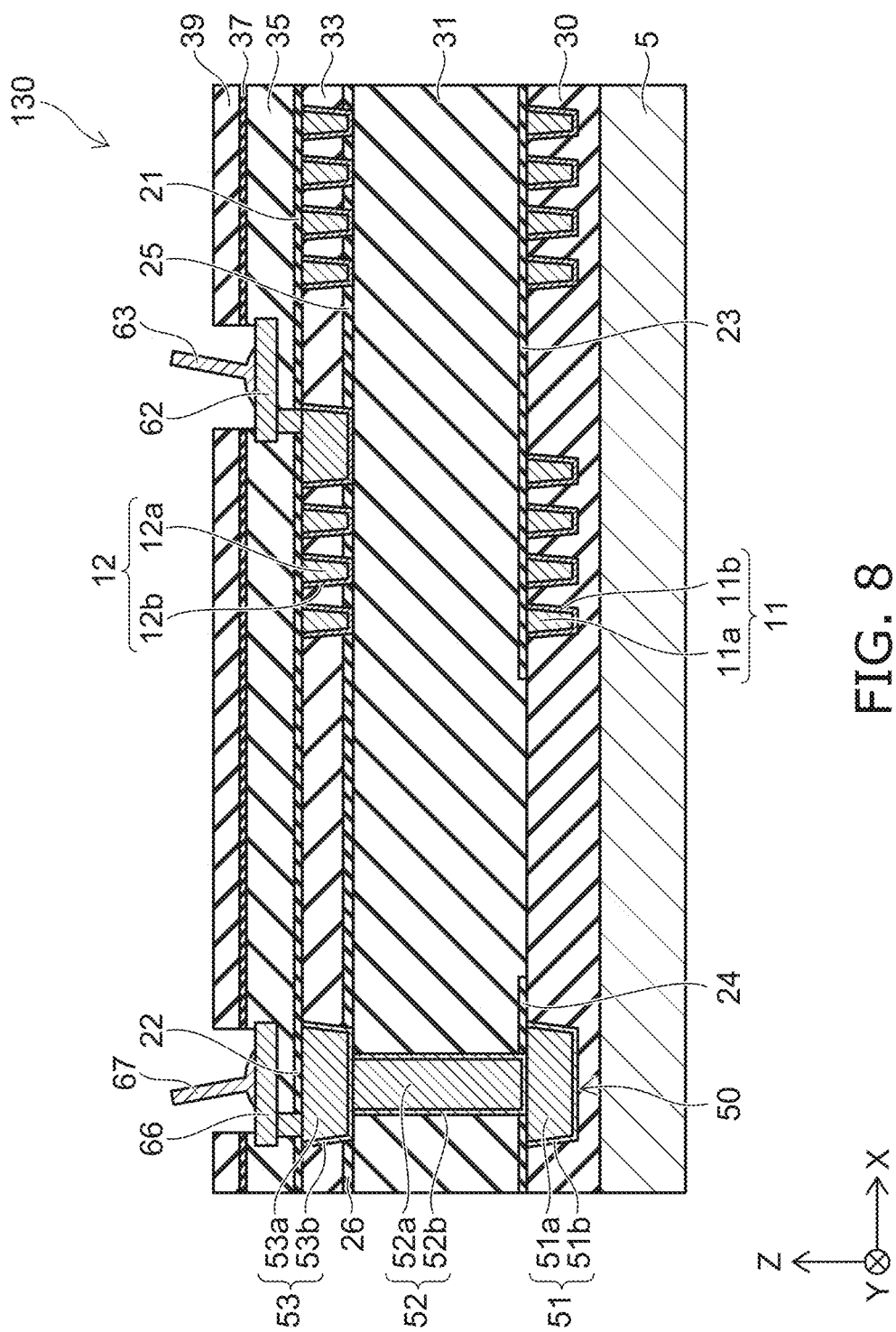

In an isolator 130 illustrated in FIG. 8, the fourth insulating layer 24 is separated from the third insulating layer 23. The fourth insulating layer 24 includes silicon, carbon, and nitrogen. The third insulating layer 23 is formed without adding carbon and includes silicon and nitrogen. The third insulating layer 23 substantially does not include carbon. The carbon concentration in the third insulating layer 23 is less than the carbon concentration in the fourth insulating layer 24.

The third insulating layer 23 and the fourth insulating layer 24 may be separated from each other or may contact each other along the X-Y plane. A portion of one of the third insulating layer 23 or the fourth insulating layer 24 may be provided on a portion of the other of the third insulating layer 23 or the fourth insulating layer 24. When the third insulating layer 23 includes silicon, carbon, and nitrogen, there is a possibility that the leakage current between the first electrode 11 and the second electrode 12 may increase. Compared to the third insulating layer 23 that includes carbon, the leakage current between the first electrode 11 and the second electrode 12 can be reduced when the third insulating layer 23 substantially does not include carbon.

Figure 9:
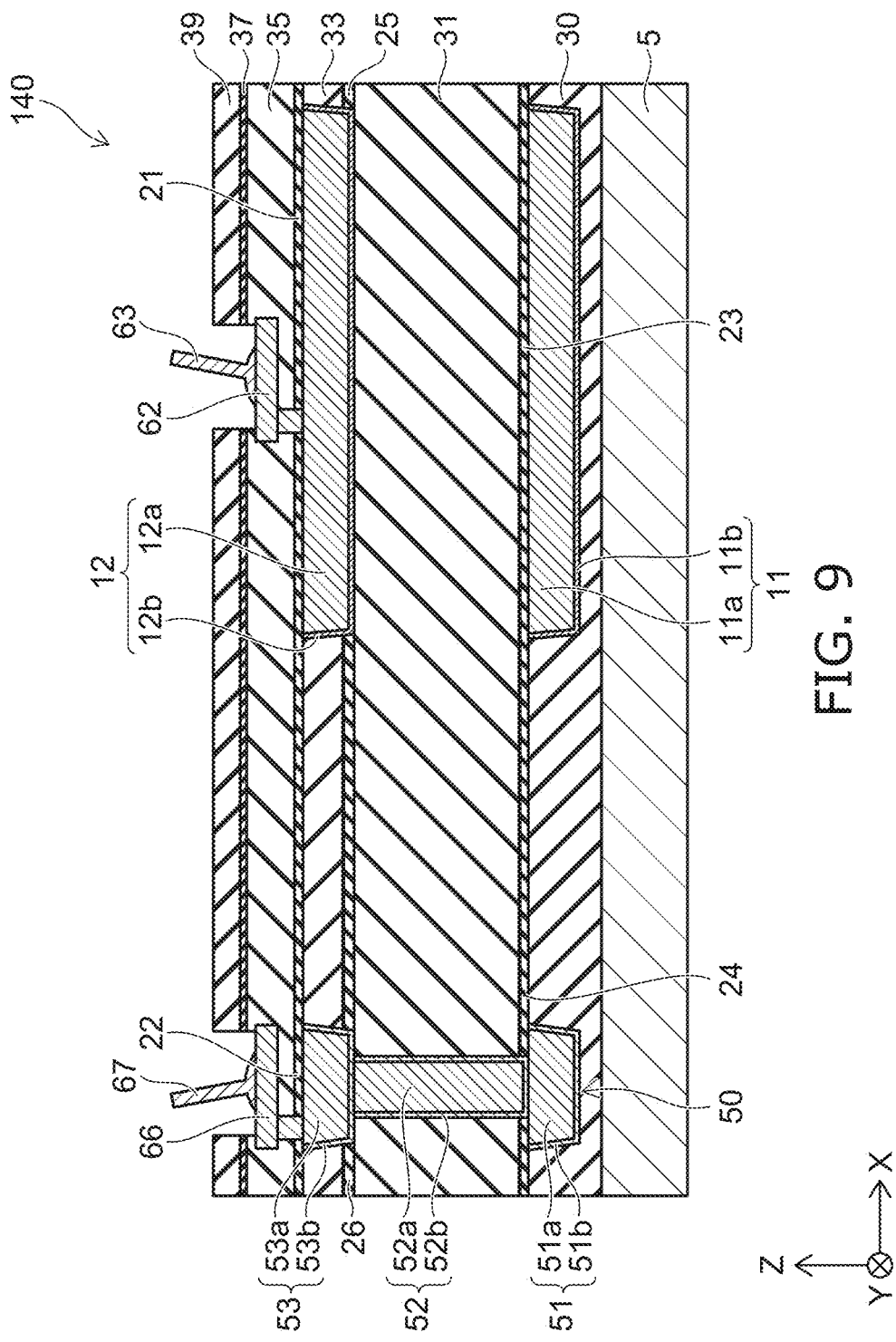

In an isolator 140 illustrated in FIG. 9, the first electrode 11 and the second electrode 12 have flat plate configurations instead of spiral configurations. For example, the first electrode 11 and the second electrode 12 are provided so that the upper surface of the first electrode 11 and the lower surface of the second electrode 12 are parallel.

Instead of the change of the magnetic field, the isolator 140 transmits the signal by utilizing a change of an electric field. Specifically, an electric field is generated between the first electrode 11 and the second electrode 12 when the second circuit 2 applies a voltage to the second electrode 12. A charge that corresponds to the electric field intensity is accumulated in the first electrode 11. The first circuit 1 detects the flow of the charge at this time and generates a signal based on the detection result. Thereby, the signal is transmitted in a state in which the current is blocked between the first electrode 11 and the second electrode 12.

Other than the structure relating to the first and second electrodes 11 and 12, a structure similar to that of the isolator 100 is applicable to the structure of the isolator 140. According to the isolator 140, similarly to the isolator 100, the reliability can be increased.

The modifications described above are combinable as appropriate. For example, the third insulating layer 23 and the fourth insulating layer 24 of the isolator 120 or 130 are applicable to the isolator 110 or 140.

Second Embodiment

Figure 10:
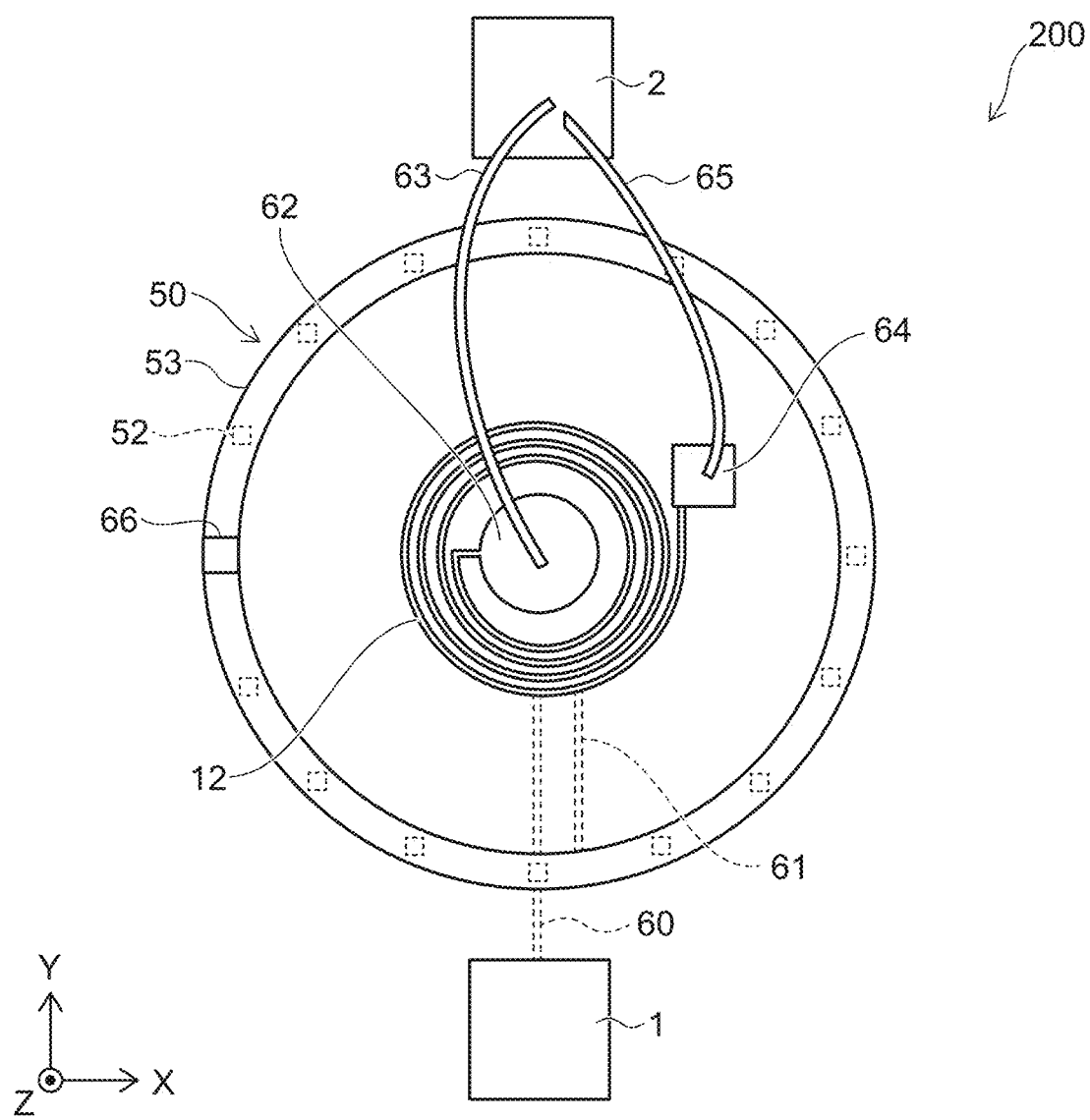
FIG. 10 is a plan view illustrating an isolator according to a second embodiment.

FIG. 10 is a plan view illustrating an isolator according to a second embodiment.

Figure 11:
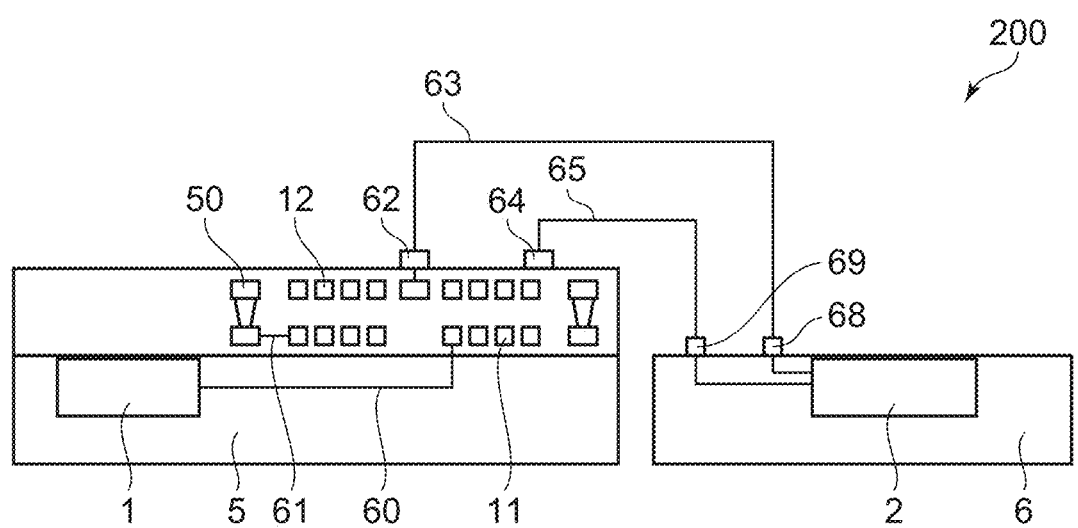
FIG. 11 is a schematic view illustrating a cross-sectional structure of the isolator according to the second embodiment.

FIG. 11 is a schematic view illustrating a cross-sectional structure of the isolator according to the second embodiment.

In the isolator 200 according to the second embodiment as illustrated in FIG. 10, one end of the first electrode 11 is electrically connected to the conductive body 50 via the wiring 61. The other end of the first electrode 11 is electrically connected to the first circuit 1 via the wiring 60.

As illustrated in FIG. 11, the first circuit 1 is provided inside the substrate 5. The second circuit 2 is provided inside a substrate 6 that is separated from the substrate 5. The pad 62 is electrically connected to a pad 68 provided on the substrate 6 via the wiring 63. The pad 64 is electrically connected to a pad 69 provided on the substrate 6 via the wiring 65. The second circuit 2 is electrically connected to the pads 68 and 69.

The structures according to the embodiments described above are applicable to the structure of the isolator 200 above the substrate 5. The reliability of the isolator 200 can be increased thereby.

Figure 12:
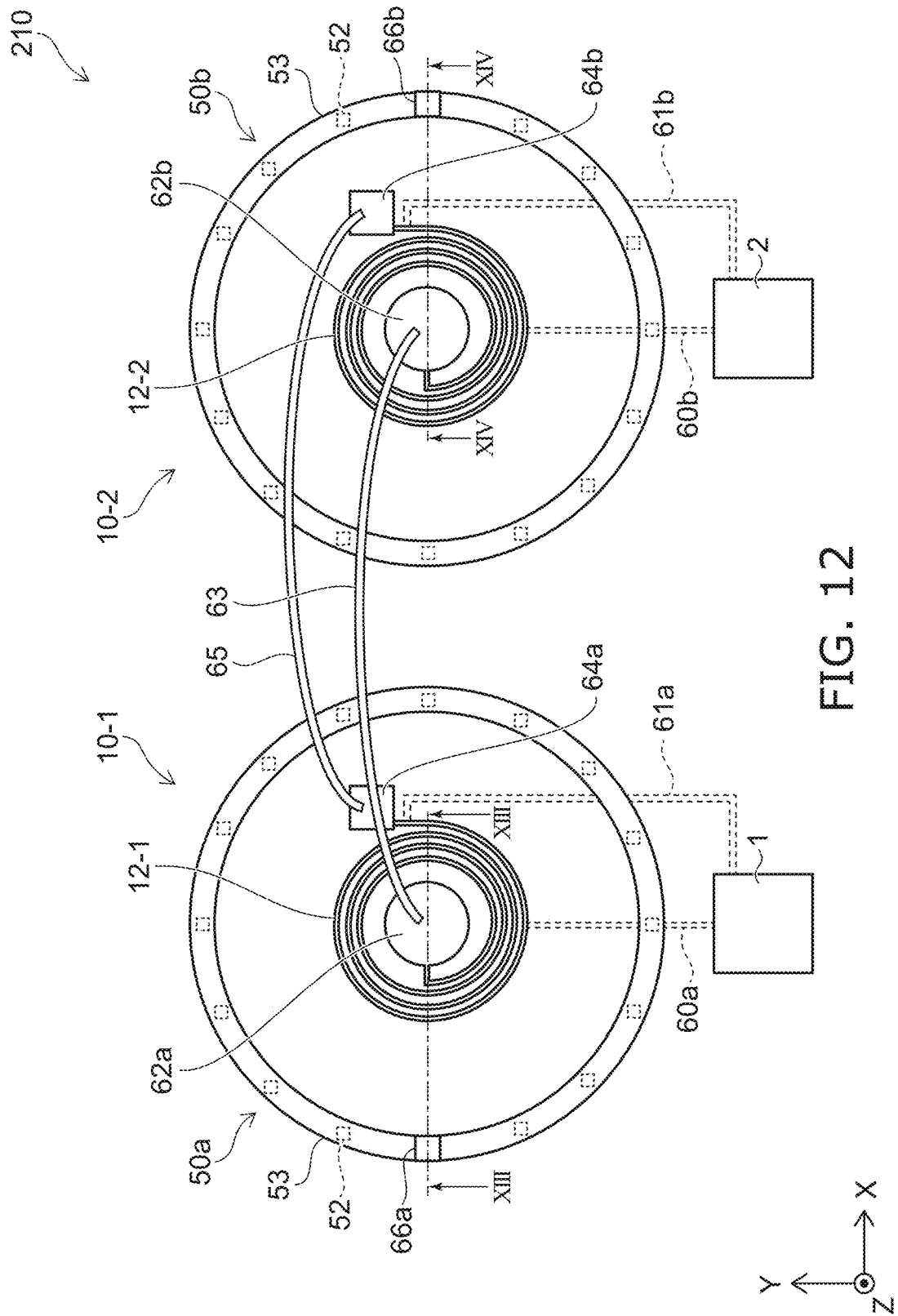
FIG. 12 is a plan view illustrating an isolator according to a first modification of the second embodiment.

FIG. 12 is a plan view illustrating an isolator according to a first modification of the second embodiment.

Figure 13:
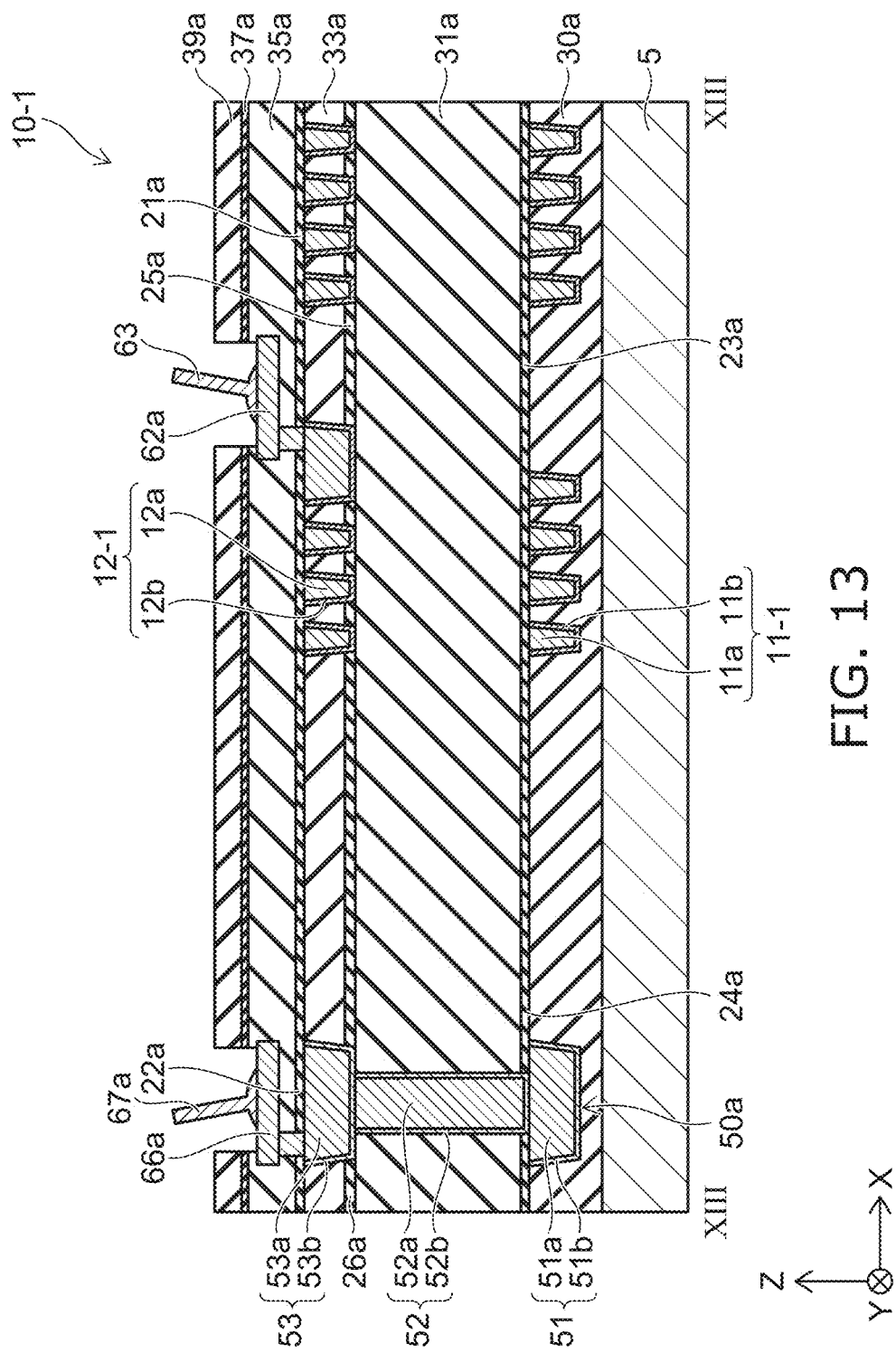
FIG. 13 is a XIII-XIII cross-sectional view of FIG. 12.

FIG. 13 is a XIII-XIII cross-sectional view of FIG. 12.

Figure 14:
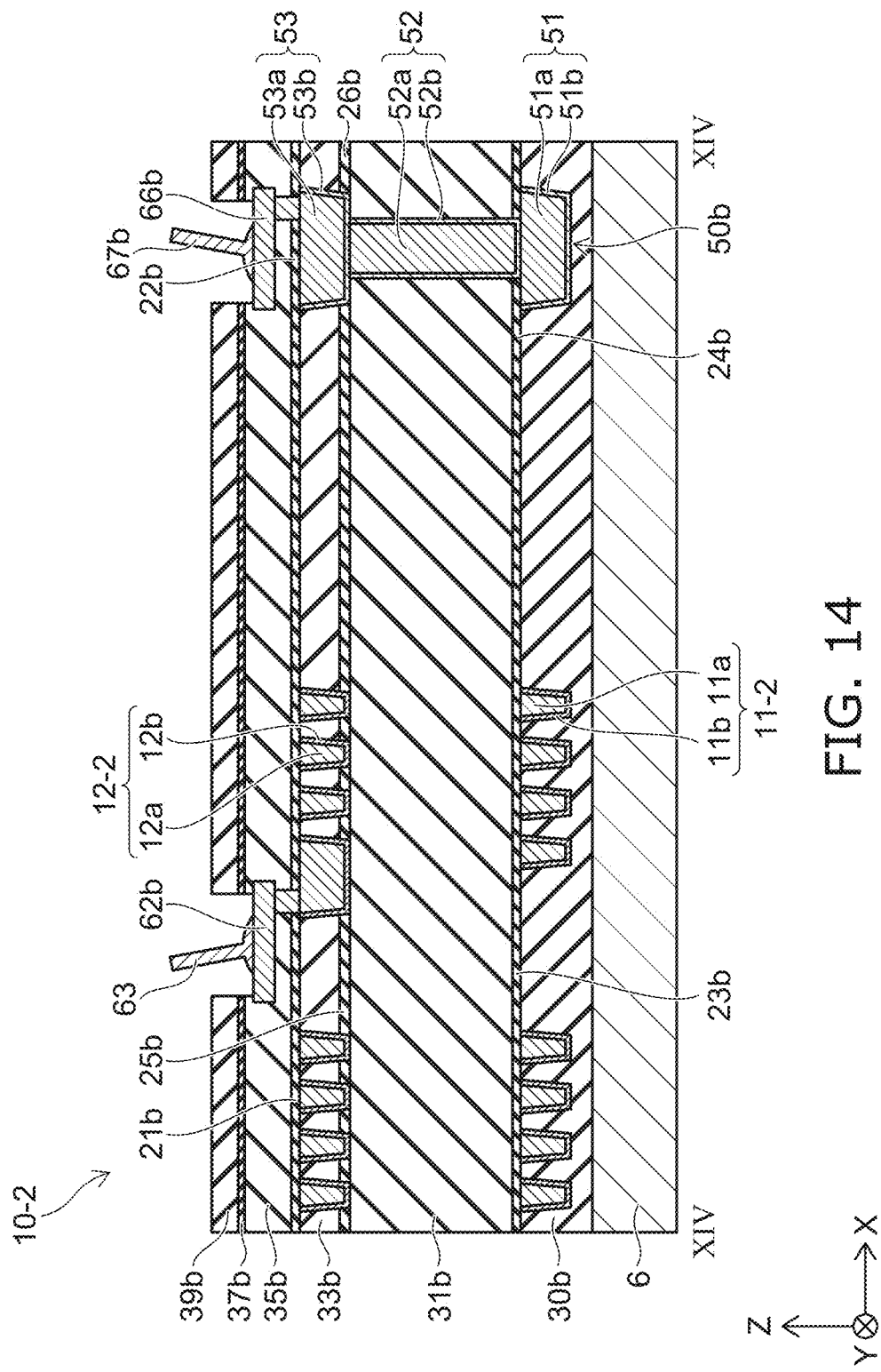
FIG. 14 is a XIV-XIV cross-sectional view of FIG. 12.

FIG. 14 is a XIV-XIV cross-sectional view of FIG. 12.

Figure 15:
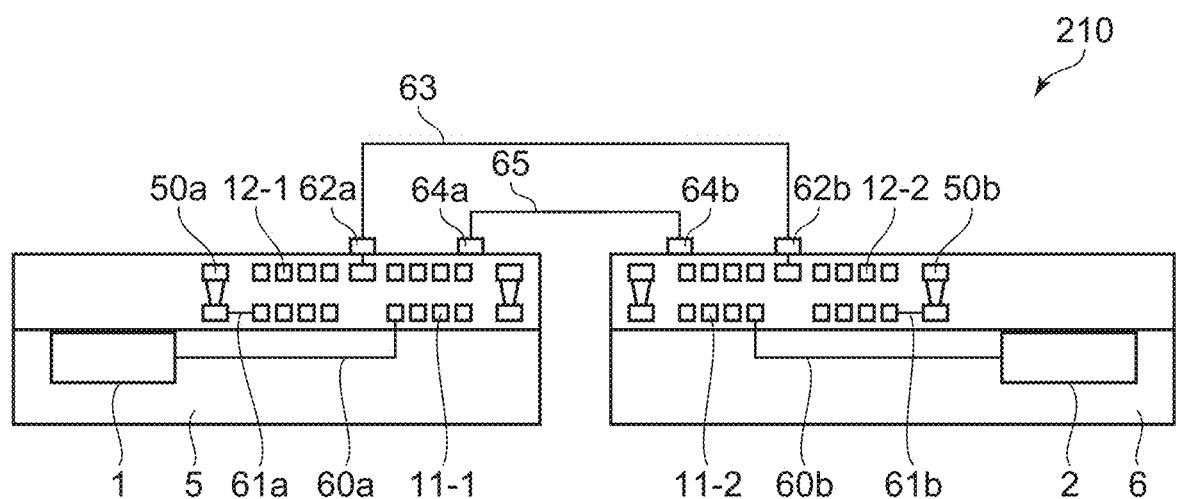
FIG. 15 is a schematic view illustrating a cross-sectional structure of the isolator according to the first modification of the second embodiment.

FIG. 15 is a schematic view illustrating a cross-sectional structure of the isolator according to the first modification of the second embodiment.

As illustrated in FIG. 12, the isolator 210 according to the first modification includes a first structure body 10-1 and a second structure body 10-2.

As illustrated in FIGS. 12, 13, and 15, the first structure body 10-1 includes an electrode 11-1, an electrode 12-1, insulating layers 21a to 26a, insulating portions 30a, 31a, 33a, 35a, 37a, and 39a, a conductive body 50a, a pad 62a, a pad 64a, and a pad 66a. For example, the structures of these components are respectively similar to the structures of the first electrode 11, the second electrode 12, the first to fourth insulating layers 21 to 24, the insulating layers 25 and 26, the insulating portion 30, the first insulating portion 31, the insulating portions 33, 35, 37, and 39, the conductive body 50, the pad 62, the pad 64, and the pad 66 illustrated in FIG. 2.

As illustrated in FIGS. 12, 14, and 15, the second structure body 10-2 includes an electrode 11-2, an electrode 12-2, insulating layers 21b to 26b, insulating portions 30b, 31b, 33b, 35b, 37b, and 39b, a conductive body 50b, a pad 62b, a pad 64b, and a pad 66b. For example, the structures of these components are respectively similar to the structures of the first electrode 11, the second electrode 12, the first to fourth insulating layers 21 to 24, the insulating layers 25 and 26, the insulating portion 30, the first insulating portion 31, the insulating portions 33, 35, 37, and 39, the conductive body 50, the pad 62, the pad 64, and the pad 66 illustrated in FIG. 2.

As illustrated in FIG. 12, the pad 62a is electrically connected to the pad 62b by the wiring 63. The pad 64a is electrically connected to the pad 64b by the wiring 65. The pad 66a is electrically connected to another conductive member by wiring 67a. The pad 66b is electrically connected to another conductive member by wiring 67b.

As illustrated in FIG. 15, the first circuit 1 is provided inside the substrate 5. The first structure body 10-1 is provided on the substrate 5. The second circuit 2 is provided inside the substrate 6. The second structure body 10-2 is provided on the substrate 6. One end of the electrode 11-1 is electrically connected to the conductive body 50a. The other end of the electrode 11-1 is electrically connected to the first circuit 1. One end of the electrode 11-2 is electrically connected to the conductive body 50b. The other end of the electrode 11-2 is electrically connected to the second circuit 2.

The structures according to the embodiments described above are applicable to the structure above the substrate 5 and the structure above the substrate 6 in the isolator 210. The diffusion of the metals from the electrodes 12-1 and 12-2 can be suppressed thereby.

In the isolator 210 illustrated in FIGS. 12 to 15, the pair of the electrodes 11-1 and 12-1 is connected in series with the pair of the electrodes 11-2 and 12-2. In other words, the first circuit 1 and the second circuit 2 are doubly insulated from each other by two pairs of electrodes connected in series. According to the isolator 210, the insulation reliability can be greater than that of a structure singly insulated by one pair of electrodes.

Figure 16:
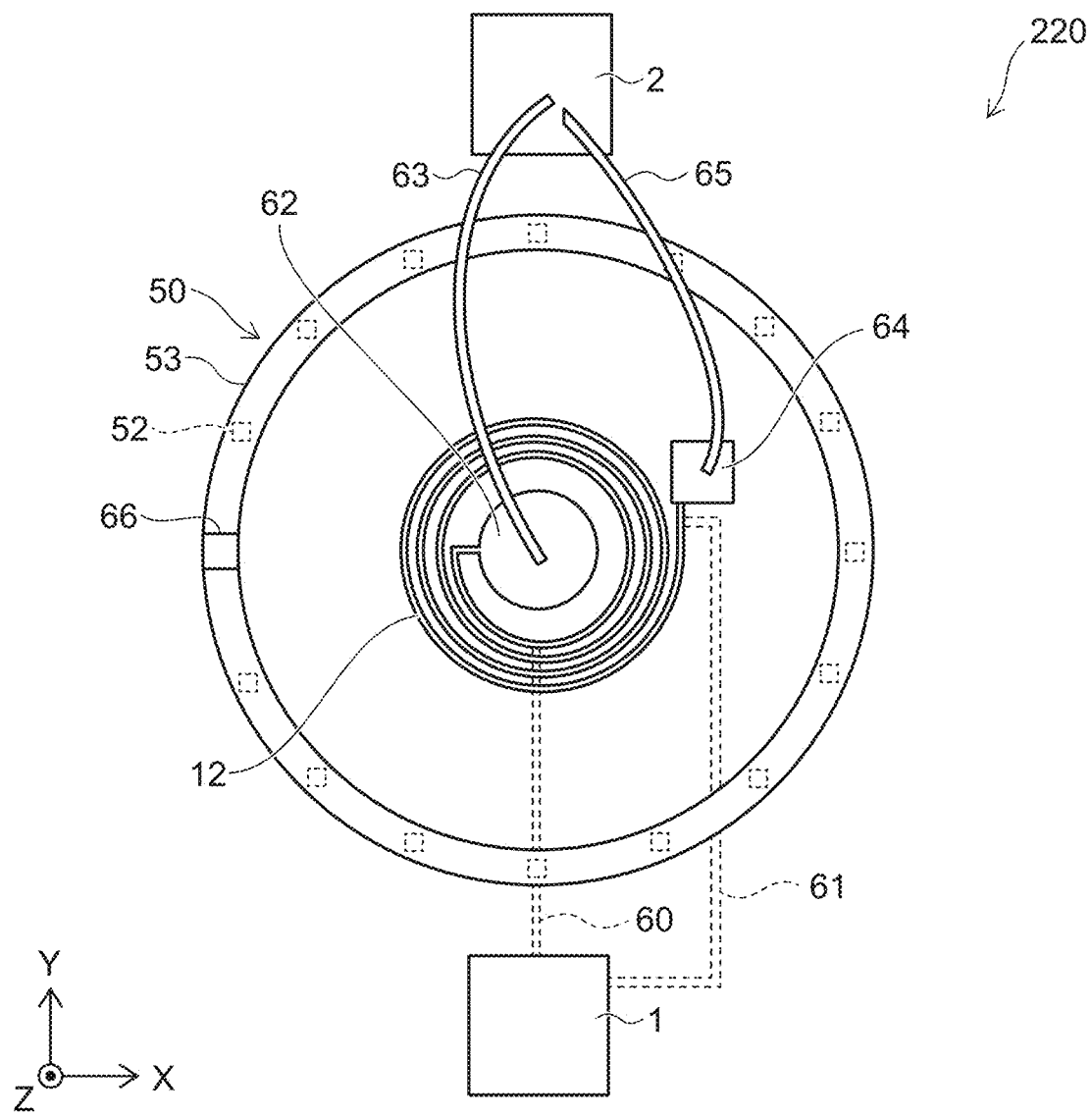
FIG. 16 is a plan view illustrating an isolator according to a second modification of the second embodiment.

FIG. 16 is a plan view illustrating an isolator according to a second modification of the second embodiment.

Figure 17:
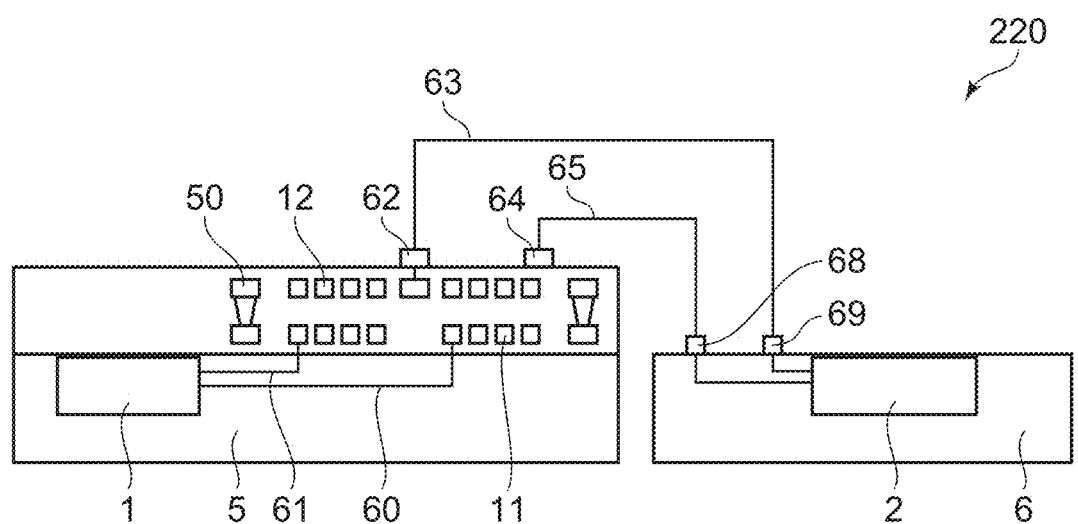
FIG. 17 is a schematic view illustrating a cross-sectional structure of the isolator according to the second modification of the second embodiment.

FIG. 17 is a schematic view illustrating a cross-sectional structure of the isolator according to the second modification of the second embodiment.

As illustrated in FIGS. 16 and 17, the isolator 220 according to the second modification of the second embodiment differs from the isolator 200 in that the two ends of the first electrode 11 are electrically connected to the first circuit 1. The conductive body 50 is electrically isolated from the first circuit 1 and the first electrode 11. As long as the conductive body 50 is set to a reference potential, the electrical connectional relationship between the first circuit 1, the first electrode 11, and the conductive body 50 is modifiable as appropriate. In such a case, it is favorable for the first electrode 11 and the conductive body 50 to be set to the same potential to reduce the potential difference between the first electrode 11 and the conductive body 50.

Figure 18:
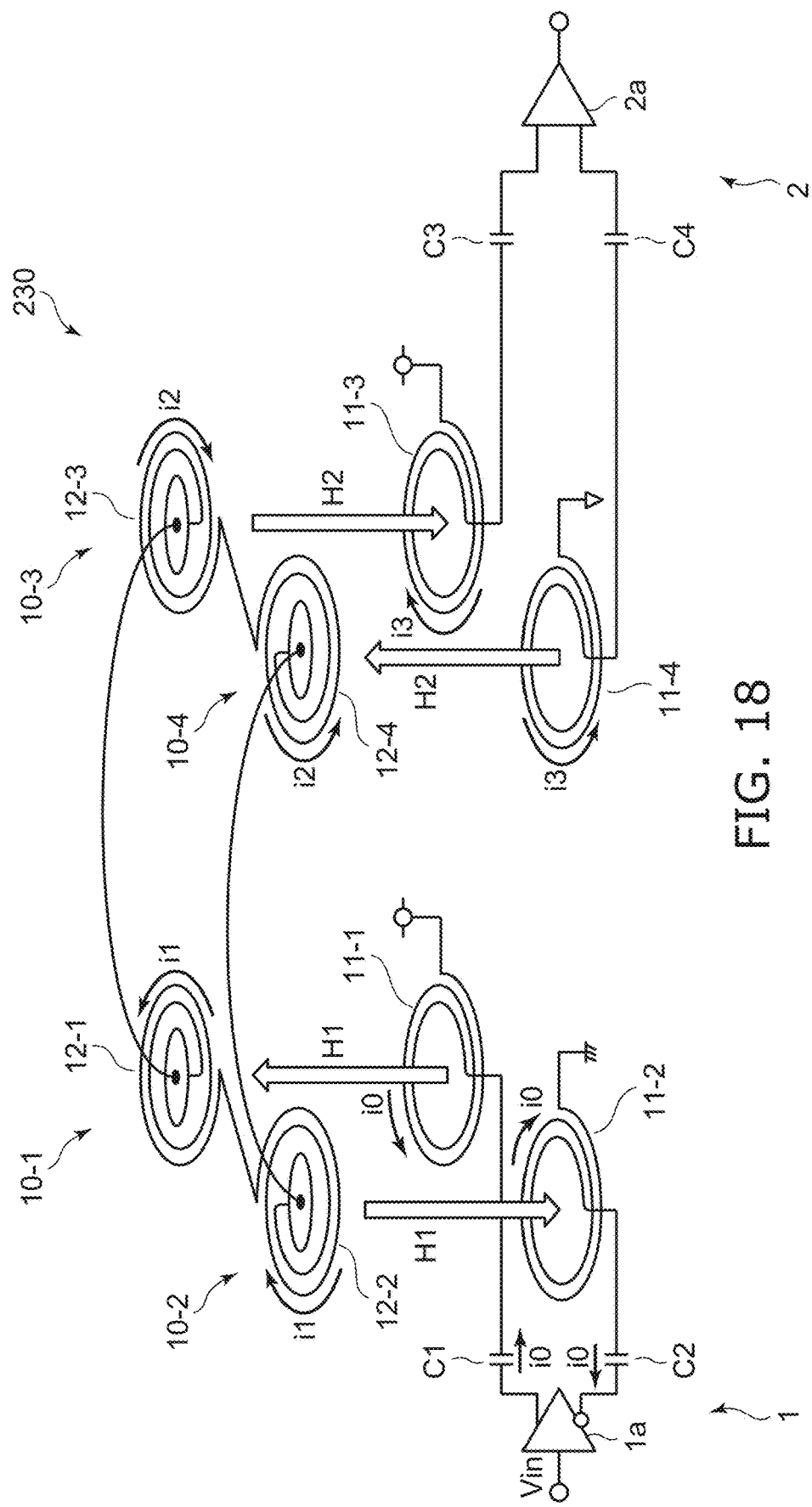
FIG. 18 is a schematic view illustrating an isolator according to a third modification of the second embodiment.

FIG. 18 is a schematic view illustrating an isolator according to a third modification of the second embodiment.

The isolator 230 according to the third modification includes the first structure body 10-1, the second structure body 10-2, a third structure body 10-3, and a fourth structure body 10-4. The first structure body 10-1 includes the electrode 11-1 and the electrode 12-1. The second structure body 10-2 includes the electrode 11-2 and the electrode 12-2. The third structure body 10-3 includes an electrode 11-3 and an electrode 12-3. The fourth structure body 10-4 includes an electrode 11-4 and an electrode 12-4. The electrodes each are coils. The first circuit 1 includes a differential driver circuit 1a, a capacitance C1, and a capacitance C2. The second circuit 2 includes a differential receiving circuit 2a, a capacitance C3, and a capacitance C4.

For example, the differential driver circuit 1a, the capacitance C1, the capacitance C2, the electrode 11-1, the electrode 11-2, the electrode 12-1, and the electrode 12-2 are formed on a not-illustrated first substrate. One end of the electrode 11-1 is connected to a first constant potential. The other end of the electrode 11-2 is connected to the capacitance C1. One end of the electrode 11-2 is connected to a second constant potential. The other end of the electrode 11-2 is connected to the capacitance C2.

One output of the differential driver circuit 1a is connected to the capacitance C1. The other output of the differential driver circuit 1a is connected to the capacitance C2. The capacitance C1 is connected between the differential driver circuit 1a and the electrode 11-1. The capacitance C2 is connected between the differential driver circuit 1a and the electrode 11-2.

The electrode 11-1 and the electrode 12-1 are stacked with an insulating portion interposed. The electrode 11-2 and the electrode 12-2 are stacked with another insulating portion interposed. The winding direction of the electrode 12-1 is the reverse of the winding direction of the electrode 12-2. One end of the electrode 12-1 is connected to one end of the electrode 12-2.

For example, the differential receiving circuit 2a, the capacitance C3, the capacitance C4, the electrode 11-3, the electrode 11-4, the electrode 12-3, and the electrode 12-4 are formed on a not-illustrated second substrate. One end of the electrode 11-3 is connected to a third constant potential. The other end of the electrode 11-3 is connected to the capacitance C3. One end of the electrode 11-4 is connected to a fourth constant potential. The other end of the electrode 11-4 is connected to the capacitance C4.

One input of the differential receiving circuit 2a is connected to the capacitance C3. The other input of the differential receiving circuit 2a is connected to the capacitance C4. The electrode 11-3 and the electrode 12-3 are stacked with an insulating portion interposed. The electrode 11-4 and the electrode 12-4 are stacked with another insulating portion interposed. One end of the electrode 12-3 is connected to one end of the electrode 12-4.

An operation will now be described. A modulated signal is transmitted in the isolator. In FIG. 18, Vin is the modulated signal. For example, an edge-triggered technique or on-off keying is used to modulate the signal. In any method, Vin is the original signal shifted toward the high frequency band.

The differential driver circuit 1a causes a current corresponding to Vin to flow in the electrode 11-1 and the electrode 11-2 in mutually-reverse directions. The electrodes 11-1 and 11-2 generate magnetic fields (H1) having mutually-reverse orientations. When the number of winds of the electrode 11-1 is equal to the number of winds of the electrode 11-2, the magnitudes of the generated magnetic fields are equal.

The induced voltage that is generated in the electrode 12-1 by the magnetic field H1 is added to the induced voltage generated in the electrode 12-2 by the magnetic field H1. A current i1 flows in the electrodes 12-1 and 12-2. The other end of the electrode 12-1 is connected to the other end of the electrode 12-3 by a bonding wire. The other end of the electrode 12-2 is connected to the other end of the electrode 12-4 by another bonding wire. The bonding wires include, for example, gold. The diameters of the bonding wires are, for example, 30 μm.

The sum of the induced voltages of the electrodes 12-1 and 12-2 is applied to the electrodes 12-3 and 12-4. A current i2 that has the same current value as the current i1 flows in the electrodes 12-3 and 12-4. The electrodes 12-3 and 12-4 generate magnetic fields (H2) having mutually-reverse orientations. When the number of winds of the electrode 12-3 is equal to the number of winds of the electrode 12-4, the magnitudes of the generated magnetic fields are equal.

The direction of the induced voltage generated in the electrode 11-3 by the magnetic field H2 is the reverse of the direction of the induced voltage generated in the electrode 11-4 by the magnetic field H2. A current i3 flows in the electrodes 11-3 and 11-4. The magnitude of the induced voltage generated in the electrode 11-3 is equal to the magnitude of the induced voltage generated in the electrode 11-4. The modulated signal is transmitted by applying, to the differential receiving circuit 2a, the sum of the induced voltages that are generated by the electrodes 11-3 and 11-4.

Third Embodiment

Figure 19:
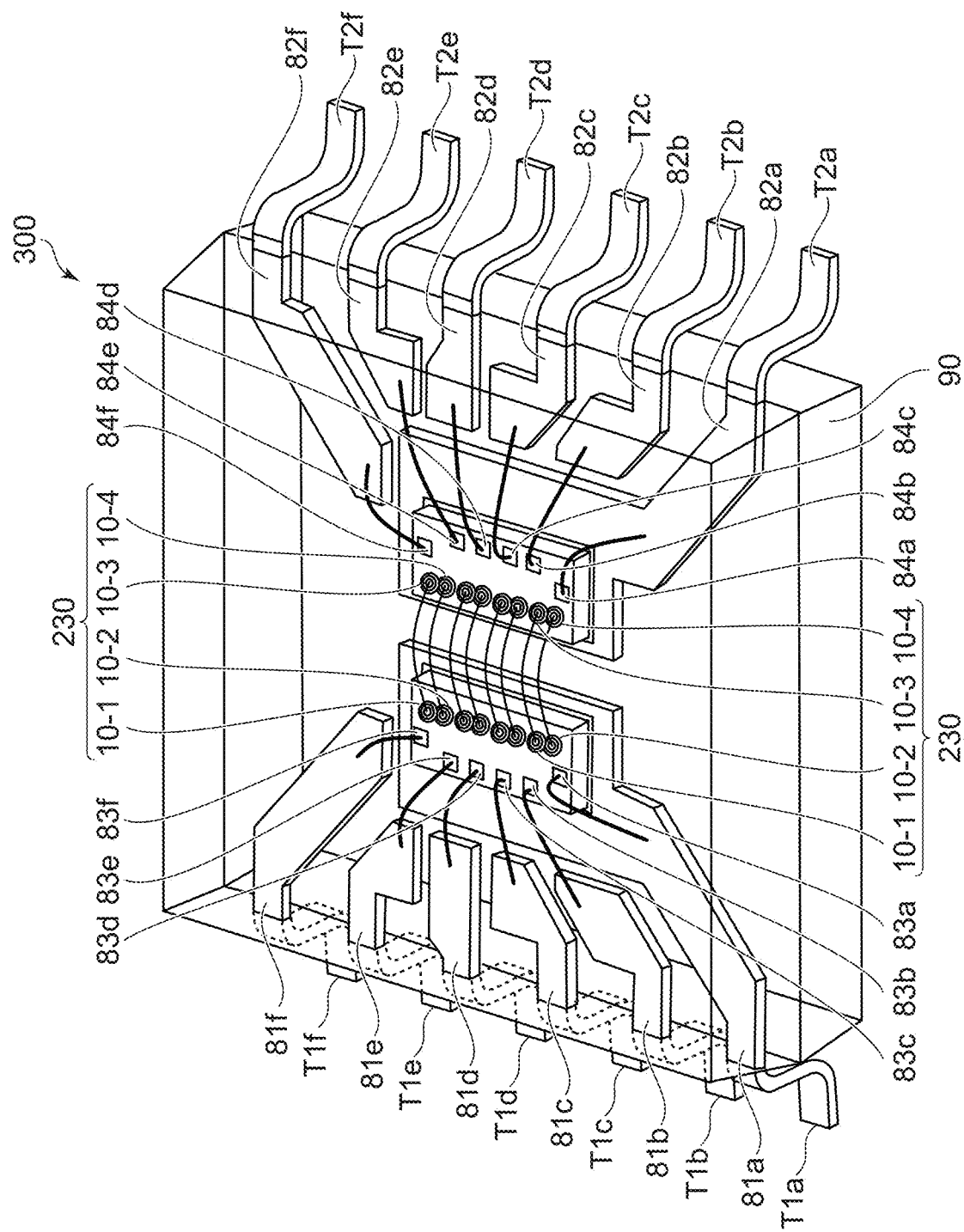
FIG. 19 is a perspective view illustrating a package according to a third embodiment.

FIG. 19 is a perspective view illustrating a package according to a third embodiment.

Figure 20:
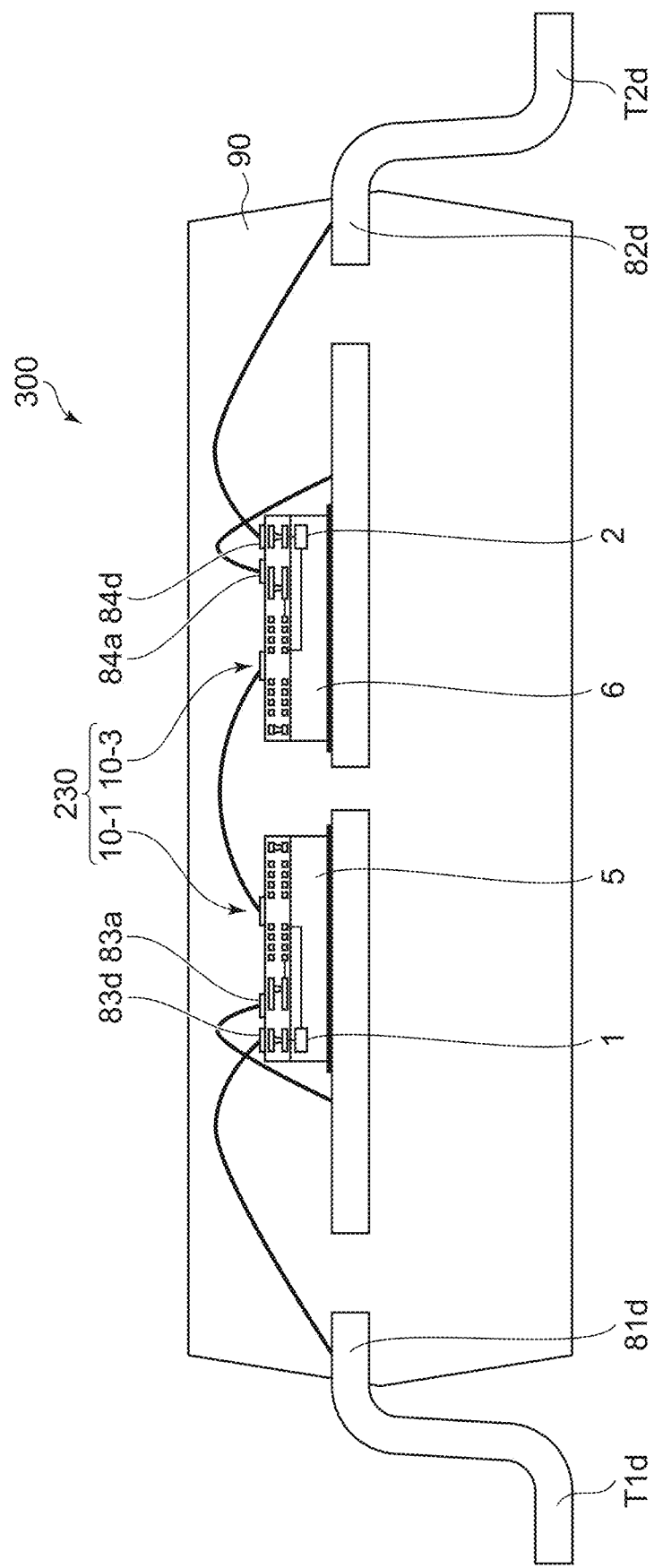
FIG. 20 is a schematic view illustrating a cross-sectional structure of the package according to the third embodiment.

FIG. 20 is a schematic view illustrating a cross-sectional structure of the package according to the third embodiment.

As illustrated in FIG. 19, the package 300 according to the third embodiment includes metal members 81a to 81f, metal members 82a to 82f, pads 83a to 83f, pads 84a to 84f, a sealing portion 90, and the multiple isolators 230.

In the illustrated example, the package 300 includes four isolators 230. Namely, four sets of the first to fourth structure bodies 10-1 to 10-4 illustrated in FIG. 18 are provided.

The multiple first structure bodies 10-1 and the multiple second structure bodies 10-2 are provided on a portion of the metal member 81a. For example, the multiple first structure bodies 10-1 and the multiple second structure bodies 10-2 are provided on one substrate 5. The substrate 5 is electrically connected to the metal member 81a. Multiple first circuits 1 are provided inside the substrate 5. One first circuit 1 is provided to correspond to a set of one first structure body 10-1 and one second structure body 10-2.

The multiple third structure bodies 10-3 and the multiple fourth structure bodies 10-4 are provided on a portion of the metal member 82a. The multiple third structure bodies 10-3 and the multiple fourth structure bodies 10-4 are provided on one substrate 6. The substrate 6 is electrically connected to the metal member 82a. Multiple second circuits 2 are provided inside the substrate 6. One second circuit 2 is provided to correspond to a set of one third structure body 10-3 and one fourth structure body 10-4.

The metal member 81a also is electrically connected to the pad 83a. The pad 83a is electrically connected to the conductive bodies 50a of the first structure bodies 10-1 and the second structure bodies 10-2. The metal member 82a also is electrically connected to the pad 84a. The pad 84a is electrically connected to the conductive bodies 50b of the third structure bodies 10-3 and the fourth structure bodies 10-4.

Metal members 81b to 81e are electrically connected respectively to pads 83b to 83e. The pads 83b to 83e are electrically connected respectively to the multiple first circuits 1. The metal member 81f is electrically connected to the pad 83f. The pad 83f is electrically connected to the multiple first circuits 1.

Metal members 82b to 82e are electrically connected respectively to pads 84b to 84e. The pads 84b to 84e are electrically connected respectively to the multiple second circuits 2. The metal member 82f is electrically connected to the pad 84f. The pad 84f is electrically connected to the multiple second circuits 2.

The sealing portion 90 covers the multiple isolators 230, the pads 84a to 84f, the pads 83a to 83f, and portions of the metal members 81a to 81f and 82a to 82f.

The metal members 81a to 81f respectively include terminals T1a to T1f. The metal members 82a to 82f respectively include terminals T2a to T2f. The terminals T1a to T1f and T2a to T2f are not covered with the sealing portion 90 and are exposed externally.

For example, the terminals T1a and T2a are connected to a reference potential. Signals to the first circuits 1 are input respectively to terminals T1b to T1e. Signals from the second circuits 2 are output respectively to terminals T2b to T2e. The terminal T1f is connected to a power supply for driving the multiple first circuits 1. The terminal T2f is connected to a power supply for driving the multiple second circuits 2.

According to the third embodiment, the likelihood of dielectric breakdown of the isolators can be reduced, and the reliability of the package 300 can be increased. Although an example is described in which four isolators 230 are provided, one or more other isolators may be provided in the package 300.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. An isolator, comprising:
   a first electrode electrically connected to a reference potential;
   a second electrode provided on the first electrode and separated from the first electrode;
   a first pad provided on one end of the second electrode and electrically connected to the one end of the second electrode;
   a second pad provided on other end of the second electrode and electrically connected to the other end of the second electrode;
   a conductive body provided around the first and second electrodes along a first plane perpendicular to a first direction, the first direction being from the first electrode toward the second electrode, the conductive body being electrically connected to the reference potential; and
   a first insulating region provided on the second electrode, the first insulating region including silicon, carbon, and nitrogen, the first insulating region directly contacting an upper surface of the second electrode, and the first insulating region covering whole area of the upper surface of the second electrode except the one end and the other end of the second electrode,
   a second insulating portion provided between the second electrode and the conductive body,
   the first insulating region directly contacting an upper surface of the second insulating portion,
   wherein a maximum concentration of a metal at an interface between the second insulating portion and the first insulating region is no more than 100 times a minimum concentration of copper in the second insulating portion and the first insulating region.

2. The isolator according to claim 1, wherein
   the conductive body is electrically connected to the first electrode.

3. The isolator according to claim 1, wherein
   a potential of the conductive body is set to be equal to a potential of the first electrode.

4. The isolator according to claim 1, further comprising:
   a second insulating region provided on the conductive body, the second insulating region including silicon, carbon, and nitrogen.

5. The isolator according to claim 4, wherein
   the second insulating region directly contacts an upper surface of the conductive body.

6. The isolator according to claim 1, further comprising:
   a first insulating portion provided between the first electrode and the second electrode; and
   a third insulating region provided between the first electrode and the first insulating portion, the third insulating region consisting of silicon and nitrogen.

7. The isolator according to claim 1, wherein
   a distance between the second electrode and the conductive body in a second direction perpendicular to the first direction is greater than a distance between the first electrode and the second electrode in the first direction.

8. The isolator according to claim 1, further comprising:
a first circuit electrically connected to the first electrode; and
a second circuit electrically connected to the second electrode.

9. The isolator according to claim 8, wherein
the first circuit is a receiving circuit, and the second circuit is a transmitting circuit.

10. The isolator according to claim 1, wherein
the first electrode and the second electrode are provided in spiral configurations.

11. The isolator according to claim 1, wherein
the second insulating portion directly contacts a side surface of the second electrode.

12. The isolator according to claim 1, further comprising:
a fifth insulating region provided around a lower portion of the second electrode along the first plane,
the fifth insulating region consisting of silicon and nitrogen.

13. The isolator according to claim 12, further comprising:
a first insulating portion provided between the first electrode and the second electrode,
the first insulating portion including silicon and oxygen,
a bottom surface of the second electrode directly contacting the first insulating portion,
the fifth insulating region directly contacting a portion of a side surface of the second electrode.

14. The isolator according to claim 1, wherein
a concentration of carbon in the first insulating region is not less than 10 mass % and not more than 45 mass %.

15. The isolator according to claim 1, wherein
a concentration of hydrogen in the first insulating region is not less than 0.5 mass % and not more than 5 mass %.

16. The isolator according to claim 1, wherein
a ratio of a mass concentration of nitrogen to a mass concentration of silicon in the first insulating region is not less than 0.2 and not more than 0.8.

17. An isolator, comprising:
a first electrode;
a second electrode provided on the first electrode and separated from the first electrode;
a first pad provided on one end of the second electrode and electrically connected to the one end of the second electrode;
a second pad provided on other end of the second electrode and electrically connected to the other end of the second electrode;
a conductive body provided around the first and second electrodes along a first plane perpendicular to a first direction, the first direction being from the first electrode toward the second electrode, the conductive body including
a first conductive portion provided around the first electrode along the first plane,
a second conductive portion provided on a portion of the first conductive portion, and
a third conductive portion provided on the second conductive portion and provided around the second electrode along the first plane;
a first insulating region provided on the second electrode, the first insulating region including silicon, carbon, and nitrogen, and the first insulating region covering whole area of an upper surface of the second electrode except the one end and the other end of the second electrode; and
a fourth insulating region including silicon, carbon, and nitrogen, the fourth insulating region being provided around a bottom portion of the second conductive portion and contacting the second conductive portion.

18. An isolator, comprising:
a first electrode electrically connected to a reference potential;
a second electrode provided on the first electrode and separated from the first electrode;
a conductive body provided around the first and second electrodes along a first plane perpendicular to a first direction, the first direction being from the first electrode toward the second electrode, the conductive body being electrically connected to the reference potential;
a first insulating region provided on the second electrode, the first insulating region including silicon, carbon, and nitrogen, the first insulating region directly contacting an upper surface of the second electrode; and
a second insulating portion provided between the second electrode and the conductive body,
the first insulating region directly contacting an upper surface of the second insulating portion,
wherein a maximum concentration of a metal at an interface between the second insulating portion and the first insulating region is no more than 100 times a minimum concentration of the metal in the second insulating portion and the first insulating region.

* * * * *